United States Patent
Rhodes et al.

(10) Patent No.: US 9,834,627 B2
(45) Date of Patent: Dec. 5, 2017

(54) POLYMERS DERIVED FROM NORBORNADIENE AND MALEIC ANHYDRIDE AND USE THEREOF

(71) Applicant: PROMERUS, LLC, Brecksville, OH (US)

(72) Inventors: Larry F Rhodes, Brecksville, OH (US); Pramod Kandanarachchi, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/394,970

(22) Filed: Dec. 30, 2016

(65) Prior Publication Data

US 2017/0190810 A1    Jul. 6, 2017

Related U.S. Application Data

(60) Provisional application No. 62/273,553, filed on Dec. 31, 2015.

(51) Int. Cl.
| | |
|---|---|
| *G03F 7/16* | (2006.01) |
| *G03F 7/039* | (2006.01) |
| *G03F 7/20* | (2006.01) |
| *G03F 7/40* | (2006.01) |
| *C08F 32/08* | (2006.01) |
| *G03F 7/32* | (2006.01) |

(52) U.S. Cl.
CPC ............. *C08F 32/08* (2013.01); *G03F 7/039* (2013.01); *G03F 7/162* (2013.01); *G03F 7/168* (2013.01); *G03F 7/2002* (2013.01); *G03F 7/322* (2013.01); *G03F 7/40* (2013.01)

(58) Field of Classification Search
CPC ...................................... C08F 32/08
See application file for complete search history.

(56) References Cited

U.S. PATENT DOCUMENTS

| 5,569,711 | A | | 10/1996 | Yamamoto et al. |
| 6,013,413 | A | * | 1/2000 | Frechet .................. C08F 32/08 430/270.1 |
| 6,165,672 | A | | 12/2000 | Jung et al. |
| 7,745,104 | B2 | * | 6/2010 | Hatakeyama ........... G03F 7/091 216/47 |
| 2007/0122736 | A1 | * | 5/2007 | Hatakeyama ............. G03F 7/11 430/270.1 |
| 2007/0122740 | A1 | * | 5/2007 | Hatakeyama ........... G03F 7/094 430/270.1 |
| 2015/0079506 | A1 | | 3/2015 | Kandanarachchi et al. |
| 2015/0079507 | A1 | | 3/2015 | Kandanarachchi et al. |
| 2015/0252132 | A1 | | 9/2015 | Onishi et al. |

FOREIGN PATENT DOCUMENTS

JP         2638887 B2  *  4/1997

OTHER PUBLICATIONS

English translation of JP 2638887 B2, A (1997) from machine translation from AIPN Japan Patent Office National Center for Industrial Property Information and Training, generated Aug. 31, 2017, 13 pages.*
Niu et al, Proc. SPIE 3049, Advances in Resist Technology and Processing XIV, (Jul. 7, 1997) pp. 113-123.*

* cited by examiner

*Primary Examiner* — Cynthia Hamilton
(74) *Attorney, Agent, or Firm* — Balaram Gupta

(57) ABSTRACT

Embodiments encompassing a series of compositions containing polymers of norbornadiene and maleic anhydride monomers which are useful in forming a variety of photopatternable structures are disclosed and claimed. The compositions are useful as permanent dielectric materials. More specifically, embodiments encompassing compositions containing a series of ter- and tetrapolymers of a variety of norbornadiene, maleic anhydride, maleimide and norbornene-type cycloolefinic monomers in which maleic anhydride is fully or partially hydrolyzed (i.e., ring opened and fully or partially esterified), and a photoactive compound are disclosed, which are useful in forming permanent dielectric materials having utility in a variety of electronic material applications, among various other uses.

20 Claims, 4 Drawing Sheets

POLYMERS DERIVED FROM NORBORNADIENE AND MALEIC ANHYDRIDE AND USE THEREOF

CROSS REFERENCE TO RELATED APPLICATIONS

This application claims the benefit of U.S. Provisional Application No. 62/273,553, filed Dec. 31, 2015, which is incorporated herein by reference in its entirety.

TECHNICAL FIELD

The present invention relates to compositions containing a series of polymers derived from a variety of polycycloolefinic monomers, maleic anhydride and maleimide monomers, which are useful as permanent dielectric materials. More specifically, the present invention relates to compositions containing a series of ter- and tetrapolymers of a variety of norbornadiene, norbornene-type cycloolefinic monomers, maleimide monomers and maleic anhydride in which maleic anhydride is fully or partially hydrolyzed (i.e., ring opened and fully or partially esterified), which are useful in forming permanent dielectric materials having utility in a variety of electronic material applications, among various other uses.

BACKGROUND

As the microelectronic devices are fabricated in smaller geometries there is an increasing demand for advanced materials that meet the stringent requirements of confined smaller geometries. In particular, sub-micron device geometries have become common place in the fabrication of a variety of microelectronics packages for memory and logic integrated circuits (ICs), liquid crystal displays (LCDs), organic light emitting diodes (OLEDs) and other radio frequency (Rf) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated with submicron dimensions.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

In addition, many of such applications require that such materials feature good thermomechanical properties, including low wafer stress (30 MPa or less), high elongation to break (ETB), high tensile stress, high glass transition temperature ($T_g$), high thermal decomposition temperature (higher than 300° C.), among others. It should be noted that a few of the currently used polyimide polymers do not meet many of these properties, for example, they generally exhibit wafer stress higher than 30 MPa. Furthermore, there is an heightened interest in developing environmentally friendly aqueous developable materials thus avoiding the use of organic solvents which results in unwanted organic waste.

Thus, it would be desirable to have a material capable of forming a self-imagable layer, which exhibits improved thermomechanical properties. Such material should also be easy to apply to a substrate, have a low dielectric constant (3.9 or less) and thermal stability to temperatures in excess of 300° C. Of course, it is also desirable to have such materials available at a lower cost and feature such properties as positive photoimaging capability, aqueous base developing capability, high transparency after heat stress and low weight loss at curing temperatures. It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides and polybenzoxazoles have low dielectric constants but still may not have low enough permittivity to be effective in highly integrated and/or miniaturized devices having increased wiring density and high signal speed. Furthermore, both polyimides and polybenzoxazoles require cure temperatures in excess of 300° C., thus rendering them unsuitable for many applications. One such known polyimide material is the positive tone photosensitive resin comprising a polyimide precursor and a diazoquinone-type compound disclosed in Japanese Patent No. 3,262,108.

Recently, it has been reported that certain copolymers containing norbornene-type repeat units having pendent maleimide groups and maleic anhydride-type repeat units are useful in certain microelectronic applications featuring self-image forming layer capability, when image-wise-exposed to actinic radiation, see co-pending U.S. Patent Application Publication No. US-2014-0087293 A1.

However, there is still a need for cost effective permanent dielectric materials having not only self photopatternable properties but also exhibiting good properties, including improved thermomechanical properties, high resolution, retaining film thickness from the unexposed regions of a positive tone formulation (i.e., low dark field loss), low thermal reflow after cure, improved stability to various chemicals and process conditions involved in the downstream process fabrication steps, such as, for example, in a device containing a redistribution layer (RDL), and/or solvent stripper operations, among others.

Thus it is an object of this invention to provide organic polymer materials having aforementioned properties for a variety of electronic and/or optoelectronic device fabrication applications.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION

Figure 1:
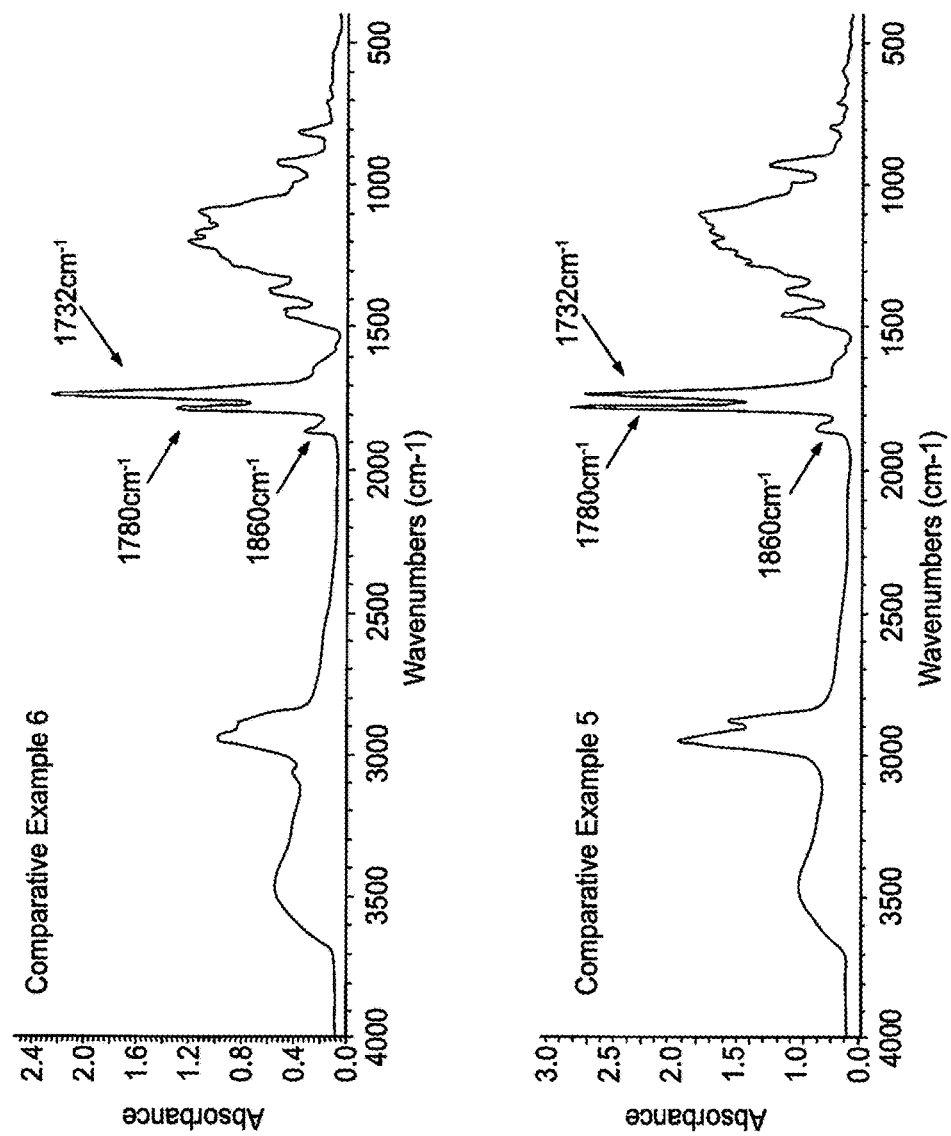
FIG. 1 shows FT-IR spectrum of two comparative composition embodiments of this invention as further discussed herein.

Embodiments in accordance with the present invention are directed to various polymers, including but not limited to, polymers that encompass at least one repeating unit derived from a certain type of norbornadiene monomer as described herein, at least one second repeating unit derived from a maleic anhydride-type monomer, as such are defined hereinafter and at least one third repeating unit derived from a maleimide, and to compositions encompassing such polymers. Such polymer compositions being capable of forming self-imagable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "⁓" denotes a position at which the bonding takes place with another repeat unit or another atom or molecule or group or moiety as appropriate with the structure of the group as shown.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1$-$C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1$-$C_{15})$alkoxy", "$(C_1$-$C_{15})$thioalkyl" "$(C_1$-$C_{15})$alkoxy$(C_1$-$C_{15})$alkyl", "hydroxy$(C_1$-$C_{15})$alkyl", "$(C_1$-$C_{15})$alkylcarbonyl", "$(C_1$-$C_{15})$alkoxycarbonyl$(C_1$-$C_{15})$alkyl", "$(C_1$-$C_{15})$alkoxycarbonyl", "amino$(C_1$-$C_{15})$alkyl", "$(C_1$-$C_{15})$alkylamino", "$(C_1$-$C_{15})$alkylcarbamoyl$(C_1$-$C_{15})$alkyl", "$(C_1$-$C_{15})$dialkylcarbamoyl$(C_1$-$C_{15})$alkyl" "mono- or di-$(C_1$-$C_{15})$alkylamino$(C_1$-$C_{15})$alkyl", "amino$(C_1$-$C_{15})$alkylcarbonyl" "diphenyl$(C_1$-$C_{15})$alkyl", "phenyl$(C_1$-$C_{15})$alkyl", "phenylcarboyl$(C_1$-$C_{15})$alkyl" and "phenoxy$(C_1$-$C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2$-$C_6)$alkenyl" includes ethenyl and straight-chained or branched propenyl, butenyl, pentenyl and hexenyl groups. Similarly, the expression "$(C_2$-$C_6)$alkynyl" includes ethynyl and propynyl, and straight-chained or branched butynyl, pentynyl and hexynyl groups.

As used herein the expression "$(C_1$-$C_4)$acyl" shall have the same meaning as "$(C_1$-$C_4)$alkanoyl", which can also be represented structurally as "R—CO—," where R is a $(C_1$-$C_3)$alkyl as defined herein. Additionally, "$(C_1$-$C_3)$alkylcarbonyl" shall mean same as $(C_1$-$C_4)$acyl. Specifically, "$(C_1$-$C_4)$acyl" shall mean formyl, acetyl or ethanoyl, propanoyl, n-butanoyl, etc. Derived expressions such as "$(C_1$-$C_4)$acyloxy" and "$(C_1$-$C_4)$acyloxyalkyl" are to be construed accordingly.

As used herein, the expression "$(C_1$-$C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1$-$C_{15})$perfluoroalkoxy", is to be construed accordingly.

As used herein, the expression "$(C_6$-$C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6$-$C_{10})$arylsulfonyl," is to be construed accordingly.

As used herein, the expression "$(C_6$-$C_{10})$aryl$(C_1$-$C_4)$alkyl" means that the $(C_6$-$C_{10})$aryl as defined herein is further attached to $(C_1$-$C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of ($C_1$-$C_6$)alkyl, ($C_2$-$C_6$)alkenyl, ($C_1$-$C_6$)perfluoroalkyl, phenyl, hydroxy, —$CO_2H$, an ester, an amide, ($C_1$-$C_6$) alkoxy, ($C_1$-$C_6$)thioalkyl, ($C_1$-$C_6$)perfluoroalkoxy, —$NH_2$, Cl, Br, I, F, —NH($C_1$-$C_6$)alkyl, and —N(($C_1$-$C_6$)alkyl)$_2$. However, any of the other suitable substituents known to one skilled in the art can also be used in these embodiments.

The statements below, wherein, for example, $R_5$ and $R_6$ are said to be independently selected from a group of substituents, means that $R_5$ and $R_6$ are independently selected, but also that where an $R_5$ variable occurs more than once in a molecule, those occurrences are independently selected (e.g., if $R_1$ and $R_2$ are each contains a group of formula (A), $R_5$ can be hydrogen in $R_1$, and $R_5$ can be methyl in $R_2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

As used herein, the terms "polymer composition," or "terpolymer composition" are used herein interchangeably and are meant to include at least one synthesized polymer or terpolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornadiene or norbornene-type monomers, in accordance with formula (I) or (IV) and maleic monomers of formula (II) or (III), wherein the resulting polymers are formed by 2,3 enchainment of norbornene-type monomers or 3,5 enchainment of norbornadiene monomers with maleic anhydride or maleimide monomers in an alternating fashion as shown below:

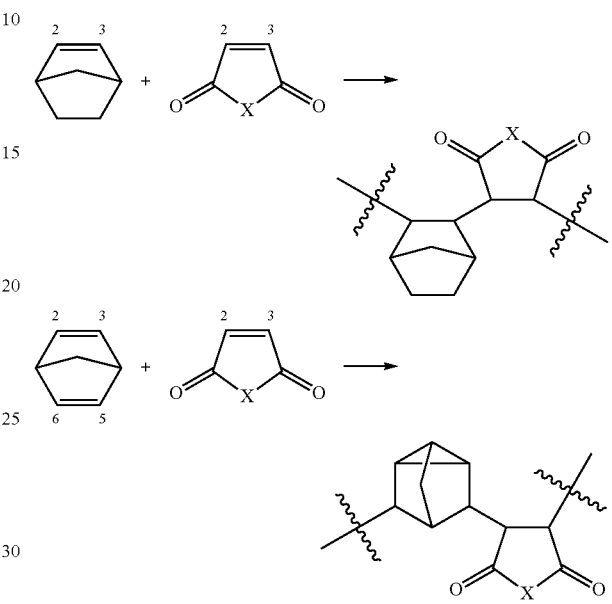

Where X is O or $NR_{10}$ where $R_{10}$ is as defined herein.

It should be understood that depending upon the monomeric compositions in a given polymer the repeat units may not always be alternating. That is to say, for example, in a polymer containing other than 50:50 molar ratios of combined norbornene-type monomers and norbornadiene monomers with combined molar amounts of maleic anhydride and maleimide monomers, the repeat units are not always alternating but with random blocks of monomers with the higher molar content. It is also possible that certain maleimide monomers may not alternate with norbornadiene or norbornene monomers and may form random blocks. In addition, some norbornadiene monomers may polymerize in 2,3 enchainment fashion similar to norbornene monomers and leaving the other double bond in the ring intact as shown below. Accordingly, all such combinations are part of this invention.

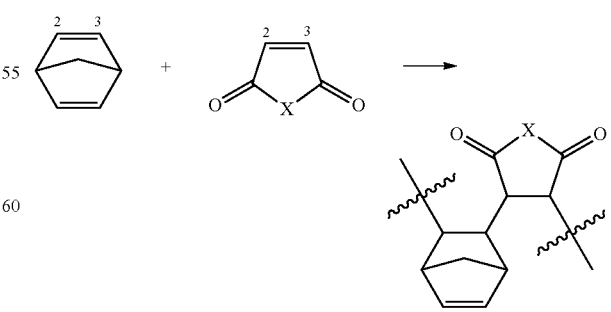

The term "low K" refers in general to a dielectric constant less than that of thermally formed silicon dioxide (3.9) and when used in reference to a "low-K material" it will be understood to mean a material having a dielectric constant of less than 3.9.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature. Such exposures are sometimes desirable after developing a positive tone image and to fix the images post developing by blanket exposure to a suitable radiation.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various first type of monomers as described herein which are part of polymer embodiments in accordance with the present invention are generally known in the art. In general, the polymers of this invention encompass a wide range of first type of monomers of formula (I) as described herein which contain a norbornadiene unit. Various other "polycyclic" repeating units encompassing the norbornadiene unit can also be used which are structurally similar to the "norbornene" type monomers of formula (IV) as further described herein as the fourth type of monomers encompassed by the polymer embodiments of this invention. As defined herein, the terms "polycyclic olefin" or "polycycloolefin" mean the same and are used interchangeably to represent several of the first or the fourth type of monomeric compounds used to prepare the polymers of this invention. As a representative example of such a compound or a monomer is norbornadiene and is generally referred to herein as addition polymerizable monomer (or the resulting repeating unit), that encompass at least one nortricyclene moiety such as shown herein.

Various norbornadienes of formula (I) employed in this invention can be synthesized by any of the procedures known to one skilled in the art or are themselves commercially available. The first type of monomers employed herein as well as several of the precursor compounds may also be prepared by methods used to prepare similar compounds as reported in the literature and as further described herein. See for instance, J. M. J. Frechet et al., Angew. Chem Int. Ed., 1998, 37, No. 5, 667-670 as well as U.S. Pat. No. 5,212,043, pertinent portions of which are incorporated herein by reference.

Similarly, various other monomers of formulae (II) or (III) as described herein are also known in the art or are themselves commercially available. Also, monomers of formulae (II) can be synthesized by any of the procedures known to one skilled in the art.

Finally, various fourth type of monomers as described herein which are part of some of the polymer embodiments in accordance with the present invention are generally known in the art. In some embodiments, the polymers of this invention encompass a wide range of fourth type of "polycycloolefin" repeating units. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by some of the embodiments in accordance with the present invention is norbornene itself, also known as bicyclo[2.2.1]hept-2-ene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6,7,8,8a-octahydro-1,4-epoxy-5,8-methanonaphthalene, and the like.

In general, the "norbornene-type" monomeric compounds employed in this invention are known in the literature or can be synthesized by any of the procedures known to one skilled in the art. Specifically, several of the starting materials used in the preparation of the fourth type of monomers used herein are known or are themselves commercially available. See for instance, U.S. Pat. Nos. 7,799,883; 8,541,523; and 8,715,900, pertinent portions of which are incorporated herein by reference.

Polymers

Embodiments in accordance with the present invention encompass polymers having at least one repeating unit derived from a norbornadiene-type monomer of formula (I) as defined herein, at least one repeating unit derived from a maleic anhydride-type monomer of formula (II) as defined herein and at least one repeating unit derived from a maleimide-type monomer of formula (III) as defined herein. It should be understood that various other types of monomers can also be used in addition to monomers of formulae (I), (II) and (III) to form the polymers employed in this invention especially the "norbornene-type" monomers of formula (IV) as further described herein. Such polymers can be prepared by any of the methods known in the art. Generally, such polymers are prepared by free radical polymerization methods. See for example, U.S. Pat. No. 8,715,900, which discloses ring-opened maleic anhydride polymers with alcohols (ROMA) and copolymerized with a variety of norbornene monomers.

Accordingly, in one aspect of this invention there is provided a polymer comprising one or more distinct first repeating unit represented by formula (IA), each of said first repeating unit is derived from a monomer of formula (I):

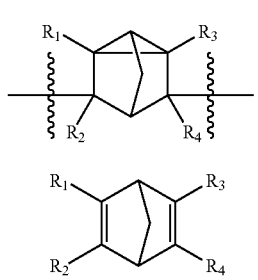

(IA)

(I)

wherein:

~~~ represents a position at which the bonding takes place with another repeat unit;

each of $R_1$, $R_2$, $R_3$ and $R_4$ is independently selected from the group consisting of hydrogen, linear or branched ($C_1$-$C_{16}$)alkyl, hydroxy($C_1$-$C_{12}$)alkyl, perfluoro($C_1$-$C_{12}$)alkyl, ($C_6$-$C_{10}$)aryl($C_1$-$C_3$)alkyl, halogen —$CO_2R$ and a group of the formula (A):

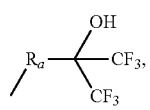

(A)

Where R is hydrogen, ($C_1$-$C_6$)alkyl or tri(($C_1$-$C_6$)alkyl) silyl; and $R_a$ is selected from the group consisting of —$(CH_2)_p$—, —$(CH_2)_q$—$OCH_2$— and —$(CH_2)_q$—$(OCH_2CH_2)_r$—$OCH_2$—, where p is an integer from 0 to 6, q is an integer from 0 to 4 and r is an integer from 0 to 3;

one or more distinct second repeating unit represented by formula (IIA), said second repeating unit is derived from a monomer of formula (II):

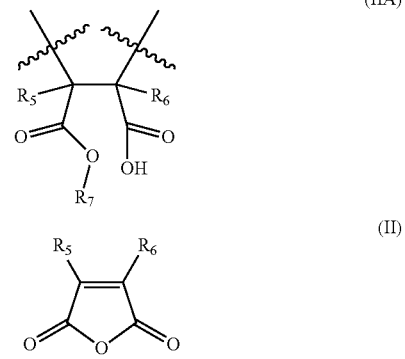

(IIA)

(II)

wherein:

each of $R_5$ and $R_6$ is independently selected from the group consisting of hydrogen, linear or branched ($C_1$-$C_9$) alkyl and fluorinated or perfluorinated($C_1$-$C_9$)alkyl;

$R_7$ is selected from the group consisting of hydrogen, linear or branched ($C_1$-$C_9$)alkyl, fluorinated or perfluorinated($C_1$-$C_9$)alkyl, and —$(CH_2)_a$—$(O$—$(CH_2)_b)_c$—$O$—($C_1$-$C_6$)alkyl, where a, b and c are integers from 1 to 4; and one or more distinct third repeating unit represented by formula (IIIA), said third repeating unit is derived from a monomer of formula (III):

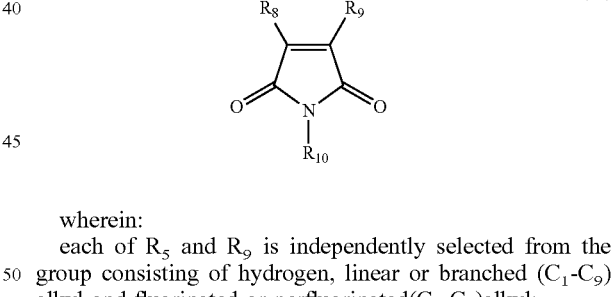

(IIIA)

(III)

wherein:

each of $R_8$ and $R_9$ is independently selected from the group consisting of hydrogen, linear or branched ($C_1$-$C_9$) alkyl and fluorinated or perfluorinated($C_1$-$C_9$)alkyl;

$R_{10}$ is selected from the group consisting of hydrogen, linear or branched ($C_1$-$C_{16}$)alkyl, ($C_3$-$C_9$)cycloalkyl, ($C_3$-$C_9$)cycloalkyl($C_1$-$C_{10}$)alkyl, ($C_6$-$C_{10}$)aryl, ($C_6$-$C_{10}$)aryl($C_1$-$C_4$)alkyl, ($C_1$-$C_{16}$)alkylCO$_2$R, ($C_1$-$C_{16}$)alkylCH$_2$OR, ($C_6$-$C_{10}$)arylCO$_2$R and ($C_6$-$C_{10}$)arylCH$_2$OR; where R is hydrogen, ($C_1$-$C_6$)alkyl or tri(($C_1$-$C_6$)alkyl)silyl.

Advantageously, the polymers of this invention encompasses various monomeric repeat units wherein molar ratio of repeating unit of formula (IA) is substantially same as the combined molar ratios of repeating units of formulae (IIA) and (IIIA). That is, as noted earlier, the molar ratios of combined monomeric units of formula (IA) are generally same as the combined molar ratios of monomeric repeat units of formulae (IIA) and (IIIA). In other words, the monomeric repeat units of formula (IA) and monomeric units of formulae (IIA) and (IIIA) generally alternate as already mentioned above. See for example, W. D. Beck, et al., J. Macromol. Sci. Chem., A5(3) 491-506 (1971).

It should further be noted that the polymer of this invention further comprises a repeat unit of formula (IB) derived from the monomer of formula (I):

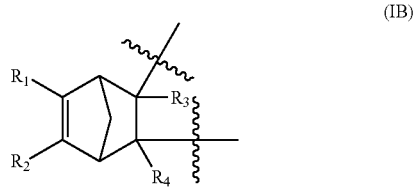

(IB)

wherein $R_1$, $R_2$, $R_3$ and $R_4$ are each as defined herein.

As noted, the polymers of this invention generally encompasses at least one monomer each of formulae (I), (II) and (III). However, the polymer of this invention can encompass one or more distinct monomer of formulae (I). Similarly, more than one distinct monomer of formula (II) can also be used as well as more than one distinct monomer of formula (III) can be employed. Thus, the polymers used to form the photosensitive or photoimagable compositions of this invention can be a terpolymer containing at least one monomer of each of formulae (I) to (III); a tetrapolymer containing at least one monomer each of formulae (I) to (IV); a tetrapolymer containing at least one monomer each of formulae (I) to (III) and an additional distinct monomer selected either from formulae (I), (II) or (III); and so on. All such various combinations are part of this invention. Accordingly, in one of the embodiments of this invention, the polymer of this invention is a terpolymer having repeat units derived from one monomer each of formulae (I), (II) and (III). In another embodiment of this invention, the polymer of this invention is a tetrapolymer having repeat units derived from one monomer each of formulae (I), (II), (III) and (IV).

In a further embodiment of this invention the polymer of this invention is a tetrapolymer having two distinct repeat units derived from two different monomers of formula (I) and one of each repeat units derived from respective monomers of formulae (II) and (III). In yet another embodiment of this invention the polymer of this invention is a tetrapolymer having one each of repeat units derived from respective monomers of formulae (I) and (II) and two distinct repeat units derived from two distinct monomers of formula (III). In another embodiment of this invention the polymer of this invention is a tetrapolymer having one each of repeat units derived from respective monomers of formulae (I) and (III) and two distinct repeat units derived from two distinct monomers of formula (II).

In another embodiment, the polymer of this invention comprises a second distinct repeat unit of formula (IIB) derived from a monomer of formula (II):

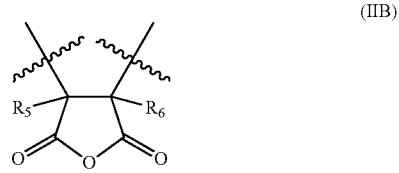

(IIB)

wherein $R_5$ and $R_6$ are as defined hereinabove.

In another embodiment of this invention, the polymer of this invention further comprises one or more distinct fourth repeat unit of formula (IVA) derived from a monomer of formula (IV):

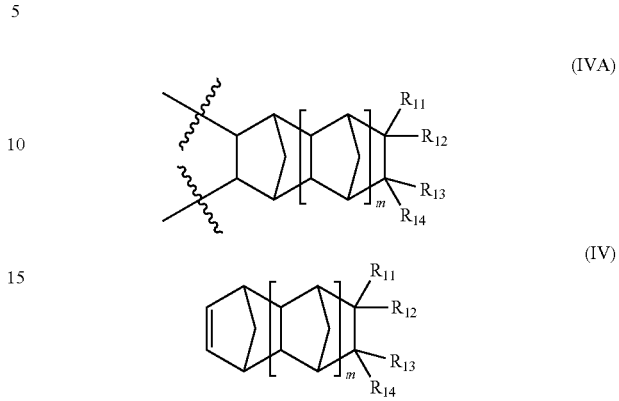

wherein:

∼ represents a position at which the bonding takes place with another repeat unit;

m is an integer 0, 1 or 2;

each of $R_{11}$, $R_{12}$, $R_{13}$ and $R_{14}$ is independently selected from the group consisting of hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $-(CH_2)_a-O-(CH_2)_b-O-(C_1-C_6)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, halogen, $-(CH_2)_a-CO_2R$, where R is hydrogen, linear or branched $(C_1-C_6)$alkyl, $(C_5-C_8)$cycloalkyl, $(C_6-C_{10})$aryl or $(C_7-C_{12})$aralkyl $(C_1-C_6)$acyloxy, and a group of the formula (A):

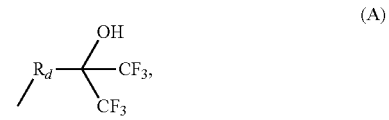

(A)

Where $R_d$ is selected from the group consisting of $-(CH_2)_p-$, $-(CH_2)_q-OCH_2-$ or $-(CH_2)_q-(OCH_2CH_2)_r-OCH_2-$, where p is an integer from 0 to 6, q is an integer from 0 to 4 and r is an integer from 0 to 3.

In a further embodiment of this invention the polymer of this invention comprises one or more distinct repeating units of formula (IA) wherein, each of $R_1$, $R_2$, $R_3$ and $R_4$ is independently selected from the group consisting of hydrogen, methyl, ethyl, linear or branched $(C_1-C_{12})$alkyl and phenyl$(C_1-C_3)$alkyl.

In yet another embodiment of this invention the polymer of this invention comprises one or more distinct repeating units of formula (IIA) wherein, $R_5$ and $R_6$ independently of each other selected from hydrogen and methyl; and $R_7$ is selected from hydrogen, methyl, ethyl, n-propyl, iso-propyl and n-butyl.

In yet another embodiment of this invention the polymer of this invention comprises one or more distinct repeating units of formula (IIIA) wherein, $R_8$ and $R_9$ independently of each other selected from hydrogen and methyl; and $R_{10}$ is selected from hydrogen, methyl, ethyl, n-propyl, iso-propyl, n-butyl, cyclopentyl, cyclohexyl, cycloheptyl, phenyl, benzyl and phenethyl.

In yet another embodiment of this invention the polymer of this invention comprises one or more distinct repeating units of formula (IVA) wherein:

m is 0;

each of $R_{11}$, $R_{12}$, $R_{13}$ and $R_{14}$ is independently selected from the group consisting of hydrogen, methyl, ethyl, linear or branched ($C_1$-$C_{12}$)alkyl, phenyl($C_1$-$C_3$)alkyl, —$(CH_2)_a$—$(O—(CH_2)_b)_c$—O—($C_1$-$C_4$)alkyl, where a is 1 or 2, b is 2 to 4 and cis 2 or 3.

As noted above, various monomers within the scope of formula (I) can be employed to form the polymers of this invention. Accordingly, one or more such exemplary monomers that can be employed to make the polymer according to this invention can be selected from the group consisting of:

bicyclo[2.2.1]hepta-2,5-diene (norbornadiene)

2-methylbicyclo[2.2.1]hepta-2,5-diene 2-butylbicyclo[2.2.1]hepta-2,5-diene 2-hexylbicyclo[2.2.1]hepta-2,5-diene 2-octylbicyclo[2.2.1]hepta-2,5-diene 2-phenethylbicyclo[2.2.1]hepta-2,5-diene tert-butyl bicyclo[2.2.1]hepta-2,5-diene-2-carboxylate trimethylsilyl bicyclo[2.2.1]hepta-2,5-diene-2-carboxylate and bicyclo[2.2.1]hepta-2,5-dien-2-ylmethanol Turning now to second repeating unit to form the polymer of this invention it is contemplated that any maleic anhydride derivative of formula (II) can be used as a monomer, including maleic anhydride itself. Exemplary monomers of such type include but not limited to those selected from the group consisting of:

maleic anhydride 2-methyl-maleic anhydride (3-methylfuran-2,5-dione)

2,3-dimethyl-maleic anhydride (3,4-dimethylfuran-2,5-dione)

2-ethyl-maleic anhydride (3-ethylfuran-2,5-dione)

2,3-diethyl-maleic anhydride (3,4-diethylfuran-2,5-dione)

2-trifluoromethyl-maleic anhydride (3-trifluoromethylfuran-2,5-dione)

2,3-Bis(trifluoromethyl)-maleic anhydride (3,4-bis(trifluoromethyl)furan-2,5-dione)

and 2-methyl-3-trifluoromethyl-maleic anhydride (3-methyl-4-(trifluoromethyl)furan-2,5-dione)

Turning now to third repeating unit to form the polymer of this invention it is contemplated that any maleimide derivative of formula (III) can be used as a monomer, including maleimide itself. Exemplary monomers of such type include but not limited to those selected from the group consisting of:

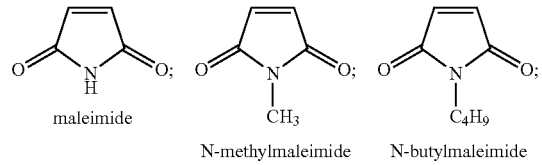

maleimide    N-methylmaleimide    N-butylmaleimide

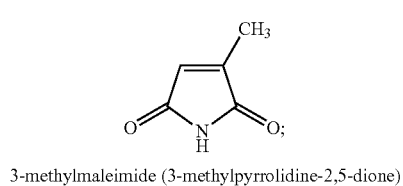

3-methylmaleimide (3-methylpyrrolidine-2,5-dione)

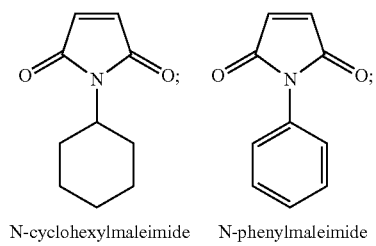

N-cyclohexylmaleimide    N-phenylmaleimide

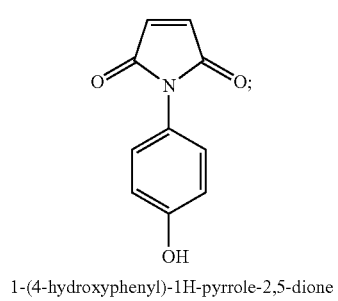

1-(4-hydroxyphenyl)-1H-pyrrole-2,5-dione

In the above, 1-(4-hydroxyphenyl)-1H-pyrrole-2,5-dione, the corresponding ortho- and meta-substituted isomers can also be used, i.e., 1-(2-hydroxyphenyl)-1H-pyrrole-2,5-dione and 1-(3-hydroxyphenyl)-1H-pyrrole-2,5-dione. The same applies to other phenyl substituted maleimides shown below.

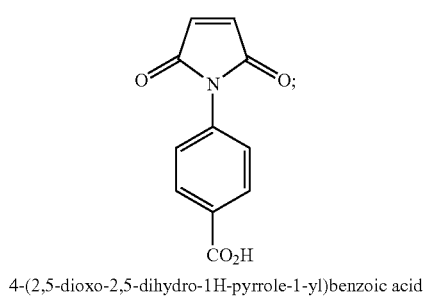

4-(2,5-dioxo-2,5-dihydro-1H-pyrrole-1-yl)benzoic acid

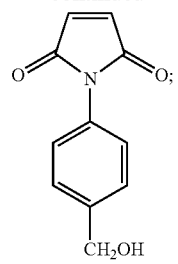

1-(4-(hydroxymethyl)phenyl)-1H-pyrrole-2,5-dione

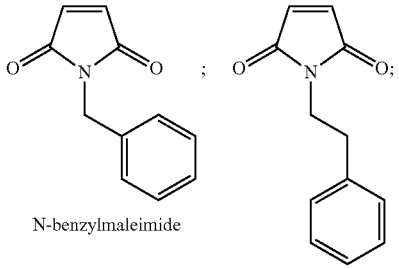

N-benzylmaleimide    N-phenethylmaleimide

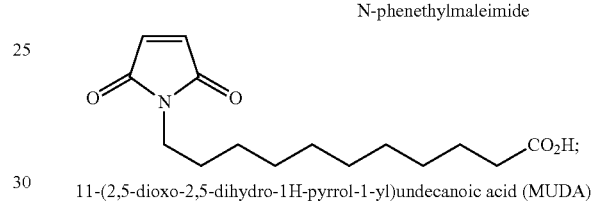

11-(2,5-dioxo-2,5-dihydro-1H-pyrrol-1-yl)undecanoic acid (MUDA)

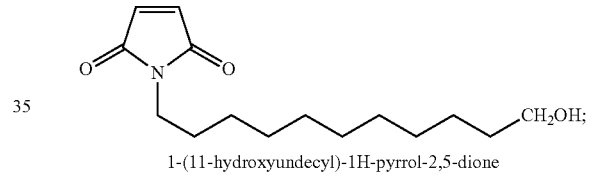

1-(11-hydroxyundecyl)-1H-pyrrol-2,5-dione

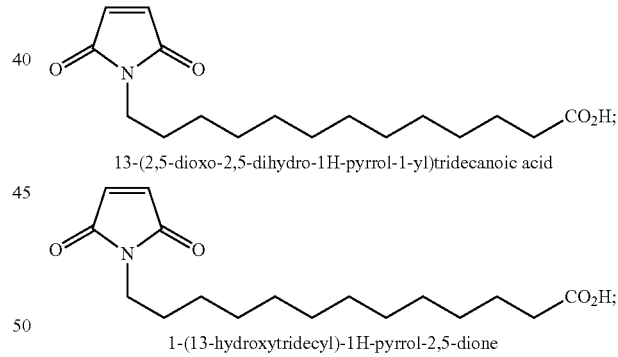

13-(2,5-dioxo-2,5-dihydro-1H-pyrrol-1-yl)tridecanoic acid 1-(13-hydroxytridecyl)-1H-pyrrol-2,5-dione Finally, any of the known "norbornene-type" monomers of formula (IV) can be used to make the polymers of this invention encompassing the repeat units of formula (IVA). Exemplary monomers which form such fourth repeating unit include but not limited to those monomers selected from the group consisting of:

norbornene (NB)    5-methylbicyclo[2.2.1]hept-2-ene (MeNB)

-continued 5-butylbicyclo[2.2.1]hept-2-ene (BuNB)

5-hexylbicyclo[2.2.1]hept-2-ene (HexNB)

5-octylbicyclo[2.2.1]hept-2-ene (OctNB)

5-decylbicyclo[2.2.1]hept-2-ene (DecNB)

5-perfluorobutylbicyclo[2.2.1]hept-2-ene (NBC$_4$F$_9$)

5-pentafluorobenzylbicyclo[2.2.1]hept-2-ene (PFBNB)

5-pentafluorophenylbicyclo[2.2.1]hept-2-ene (PFPNB)

5-benzylbicyclo[2.2.1]hept-2-ene (BzNB)

5-phenethylbicyclo[2.2.1]hept-2-ene (PENB)

1,2,3,4,4a,5,8,8a-octahydro-1,4:5,8-dimethanonaphthalene (TD)

bicyclo[2.2.1]hept-5-en-2-ylmethyl acetate (MeOAcNB)

bicyclo[2.2.1]hept-5-en-2-ylmethanol (MeOHNB)

-continued 2-(bicyclo[2.2.1]hept-5-en-2-yl)propan-2-ol (NBXOH)

norborneyl-2-trifluoromethyl-3,3,3-trifluoropropan-2-ol (HFANB)

2-(bicyclo[2.2.1]hept-5-en-2-ylmethoxy)ethyl acetate (NBCH$_2$GlyOAC)

2-(bicyclo[2.2.1]hept-5-en-2-ylmethoxy)ethanol (NBCH$_2$GlyOH)

5-((2-(2-methoxyethoxy)ethoxy)methyl)bicyclo[2.2.1]hept-2-ene (NBTON)

1-(bicyclo[2.2.1]hept-5-en-2-yl)-2,5,8,11-tetraoxadodecane (NBTODD)

5-(3-methoxybutoxy)methyl-2-norbornene (NB-3-MBM)

5-(3-methoxypropanoxy)methyl-2-norbornene (NB-3-MPM)

5-(2-(2-ethoxyethoxy)ethyl)bicyclo[2.2.1]hept-2-ene 5-(2-(2-(2-propoxyethoxy)ethoxy)ethoxy)bicyclo[2.2.1]hept-2-ene 5-(3,4-difluorobenzyl)bicyclo[2.2.1]hept-2-ene (NBCH$_2$C$_6$H$_3$F$_2$)

5-(4-(trifluoromethyl)benzyl)bicyclo[2.2.1]hept-2-ene (NBCH$_2$C$_6$H$_4$CF$_3$)

-continued

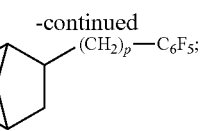

5-((perfluorophenyl)alkyl)bicyclo[2.2.1]hept-2-ene (NBalkylC$_6$F$_5$), where
p = 1 (methyl), 2 (ethyl), 3 (propyl), 4 (butyl), 5 (pentyl) or 6 (hexyl)

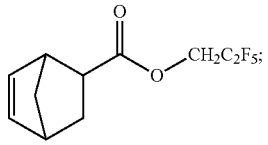

2,2,3,3,3-pentafluoropropyl bicyclo[2.2.1]hept-5-ene-2-carboxylate
(PFPrCNB)

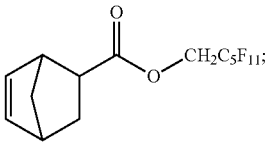

perfluoropentylmethyl bicyclo[2.2.1]hept-5-ene-2-carboxylate
(PFPMeCNB)

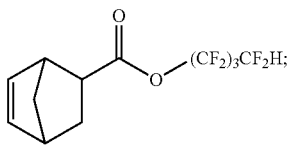

1,1,2,2,3,3,4,4-octafluorobutyl bicyclo[2.2.1]hept-5-ene-2-carboxylate
(FOCHNB)

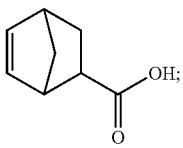

bicyclo[2.2.1]hept-5-ene-2-carboxylic acid (Acid NB)

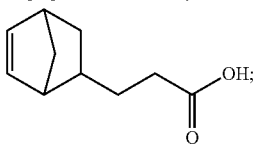

3-(bicyclo[2.2.1]hept-5-en-2-yl)propanoic acid (NBEtCOOH)

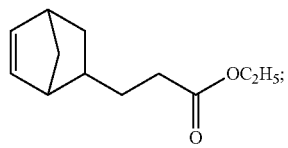

ethyl 3-(bicyclo[2.2.1]hept-5-en-2-yl)propanoate (EPEsNB)

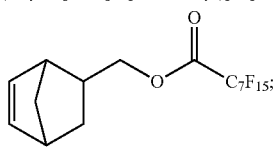  and bicyclo[2.2.1]hept-5-en-2-ylmethyl perfluorooctanoate (C$_8$PFAcNB)

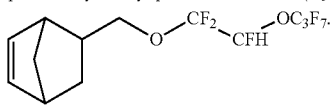

5-((1,1,2-trifluoro-2-(perfluoropropoxy)ethoxy)methyl)bicyclo[2.2.1]hept-2-ene (PPVENB)

In yet another embodiment of this invention the polymer according to this invention contain various combinations of monomer repeat units of formulae (IA), (IB), (IIA), (IIB), (IIIA) and (IVA). Non-limiting examples of such specific polymers within the scope of this invention is selected from the group consisting of:

a terpolymer of norbornadiene (NBD), maleic anhydride in which maleic anhydride repeating unit is ring opened with methanol and N-phenylmaleimide (42:28:30 molar ratio);

a terpolymer of norbornadiene (NBD), maleic anhydride in which maleic anhydride repeating unit is ring opened with methanol and maleimide (38:49:13 molar ratio);

a terpolymer of norbornadiene (NBD), maleic anhydride in which maleic anhydride repeating unit is ring opened with methanol and N-cyclohexyl-maleimide (50:27:23 molar ratio);

a tetrapolymer of norbornadiene (NBD), 5-((2-(2-methoxyethoxy)ethoxy)methyl)-bicyclo[2.2.1]hept-2-ene (NBTON), maleic anhydride in which maleic anhydride repeating unit is ring opened with methanol and N-phenylmaleimide (33:10:24:33 molar ratio);

a tetrapolymer of norbornadiene (NBD), maleic anhydride in which maleic anhydride repeating unit is ring opened with methanol, N-cyclohexylmaleimide (N-CyHexMI) and maleimide (53 mole percent of NBD and combined 47 mole percent of MA/N-CyHexMI and MI); and a tetrapolymer of norbornadiene (NBD), maleic anhydride in which maleic anhydride repeating unit is ring opened with methanol, N-phenylmaleimide and maleimide.

Useful monomers for embodiments in accordance with the present invention are described generally hereinabove. As also noted above the polymer of this invention generally encompasses equal molar amounts of repeat units derived from one or more monomers of formulae (I) and (IV), if present, and repeat units derived from one or more monomers of formulae (II) and (III). That is to say that the total molar amounts of one or more distinct types of monomers of formula (I) and (IV) and the total molar amounts of one or more distinct types of monomers of formula (II) and (III) are generally the same. However, in some embodiments the total mole ratios of repeat units of formulae (IA) and (IB), if present, and (IVA) can be higher or lower than 50 mole percent, and thus the total mole ratios of repeat units of formulae (IIA) and (IIB), if present, and (IIIA) can be different than 50 mole percent. Accordingly, in some embodiments the total mole ratios of repeat units of formulae (IA) and (IB), if present, and (IVA), if present, is in the range of from 30 to 60 mole percent, in other embodiments the combined mole percent of repeat units of formulae (IA) and (IB), if present, and (IVA), if present, is in the range of from 40 to 60 mole percent and in other embodiments it can be from 45 to 55 mole percent. Accordingly, in some embodiments the total mole ratios of repeat units of formulae (IIA) and (IIB), if present, and (IIIA) is in the range of from 40 to 70 mole percent, in other embodiments the combined mole percent of repeat units of formulae (IIA) and (IIB), if present, and (IIIA) is in the range of from 40 to 60 mole percent and in other embodiments it can be from 45 to 55 mole percent.

Advantageously, it has now been found that the polymers of this invention contain at least three mole percent of repeat units of formula (IIIA). In some other embodiments the mole percent of repeat units of formula (IIIA) is in the range of from 4 mole percent to 30 mole percent, in some other embodiments it is in the range of from 5 to 20 mole percent and in other embodiments it is in the range of from 8 to 15 mole percent. Similarly, the total mole percent of repeat units of formula (IIA) and (IIB), if present, is in the range of from 20 mole percent to 60 mole percent, in some other embodiments it is in the range of from 25 to 50 mole percent and in other embodiments it is in the range of from 30 to 40 mole percent. The total mole percent of repeat units of formula (IA) and (IB), if present, is in the range of from 30 mole percent to 60 mole percent, in some other embodiments it is in the range of from 35 to 55 mole percent and in other embodiments it is in the range of from 40 to 50 mole percent. Finally, the mole percent of repeat units of formula (IVA), if present, is in the range of from 0 mole percent to 20 mole percent, in some other embodiments it is in the range of from 5 to 15 mole percent and in other embodiments it is in the range of from 10 to 12 mole percent.

Generally speaking, as to various possible substituents defined for $R_1$, $R_2$, $R_3$, $R_4$, it should be noted that such substituents can broadly be defined as "hydrocarbyl" group. As defined hereinabove, such definition of "hydrocarbyl" group includes any $C_1$ to $C_{30}$ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neo-pentyl, hexyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $(C_1-C_{10})$alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

Polymer Preparation

In general, the polymers of this invention can be prepared by any one of the known procedures in the art. For instance, one or more monomers of formula (I) as described herein can be polymerized along with one or more monomers of formulae (II) and (III) to form the polymers of this invention containing the respective monomeric repeat units as represented by formulae (IA), (IB), (IIB) and (IIIA) which are called hereinafter as "COMA-MI" polymers. The maleic anhydride repeat units of formula (IIB) can also be ring opened either partially or completely by subjecting to suitable reaction conditions to form repeat units of formula (IIA) as described herein, which are called hereinafter as "ROMA-MI" polymers. Further, one or more monomers of formula (IV) can be further included in these polymerization reactions to form polymer compositions which would additionally include repeat units of formula (IVA). Again, any of the polymerization methods can be employed to form the polymer compositions of this invention. In general, the polymerization can be carried out either in solution using a desirable solvent or in mass, and in both instances, suitably in the presence of a catalyst or an initiator. Any of the known catalyst system which brings about the polymerization of the monomers of formula (I) with monomers of formula (II) can be used along with monomers of formula (III), further in combination with monomers of formula (IV).

Advantageously, it has now been found that polymers of this invention can be prepared by any of the known free radical polymerization procedures. Typically in a free radical polymerization process, the monomers are polymerized in a solvent at an elevated temperature (about 50° C. to about 150° C.) in the presence of a free radical initiator. Suitable initiators include but are not limited to azo compounds and peroxides. Non-limiting examples of azo compounds include azobisisobutyronitrile (AIBN), (E)-dimethyl 2,2'-(diazene-1,2-diyl)bis(2-methylpropanoate) (AMMP), (E)-2,2'-(diazene-1,2-diyl)bis(2,4-dimethylpentanenitrile (ADMPN), 1,1'-azobis(cyclohexanecarbonitrile) (ABCN), azobisisocapronitrile and azobisisovaleronitrile. Non-limiting examples of peroxides include hydrogen peroxide, tert-butylhydroperoxide, di-(tertiary)-butyl peroxide, benzoyl peroxide, lauryl peroxide, and methyl ethyl ketone peroxide. As noted, any of the other known initiators, including other azo compounds and peroxides can also be used in this polymerization process.

Suitable polymerization solvents for the aforementioned free radical polymerization reactions include hydrocarbon, haloalkane, ketone and aromatic solvents, among other suitable solvents. Exemplary hydrocarbon solvents include but are not limited to alkanes and cycloalkanes such as pentane, hexane, heptane and cyclohexane. Exemplary haloalkane solvents include but or not limited to dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, 1-chloropentane, Freon™ 112 halocarbon solvent. Exemplary ketone solvents include cyclopentanone and cyclohexanone. Exemplary aromatic solvents include but are not limited to benzene, toluene, xylene, mesitylene, chlorobenzene, and o-dichlorobenzene. Other organic solvents such as diethyl ether, tetrahydrofuran, acetates (e.g., ethyl acetate) and other esters, lactones, ketones and amides, including N,N-dimethylformamide (DMF), N,N-dimethylacetamide (DMAc), N-methylpyrrolidone (NMP), propyleneglycol monomethylether acetate (PGMEA), are also useful. Mixtures of one or more of the foregoing solvents can be utilized as a polymerization solvent. In some embodiments the solvents employed include cyclohexane, toluene, mesitylene, dichloromethane and 1,2-dichloroethane.

As noted, the polymer as obtained above is then subjected to suitable reaction conditions to ring open the maleic anhydride repeat units of formula (IIB) to form the repeat units of formula (IIA), the ROMA polymers employed in the compositions of this invention. Any of the known methods which would bring about such a ring opening can be employed in this method of the invention. Non-limiting examples of such ring opening reactions include reacting the polymer with a suitable alcohol optionally in the presence of a suitable base or an acid. Non-limiting examples of alcohols include methanol, ethanol, n-propanol, iso-propanol, n-butanol, iso-butanol, tert-butanol, pentanol, hexanol, octanol, fluoroalkanol, methoxyethanol, methoxyethoxymethanol, methoxyethoxyethanol, butoxyethoxyethanol, and the like. Non-limiting examples of base include sodium hydroxide, lithium hydroxide, potassium hydroxide, cesium hydroxide, ammonia, ammonium hydroxide, magnesium hydroxide, calcium hydroxide, barium hydroxide, and the like. Various other known organic bases can also be employed. Representative examples of which include, tetramethylammonium hydroxide (TMAH), tetraethylammonium hydroxide (TEAH), pyridine, imidazole, and the like. Non-limiting examples of acids include acetic acid, trifluoroacetic acid, sulfuric acid, hydrochloric acid, methanesulfonic acid, trifluoromethanesulfonic acid, p-toluenesulfonic acid, benzenesulfonic acid, and mixtures thereof. As noted, in some embodiments the ring opening can also be carried without any acid or base.

The aforementioned ring opening reactions can be carried out using any of the known methods in the art. Typically, such reactions are carried out in a suitable solvent or a mixture of solvents in the presence of a base and an alcohol. Examples of base and alcohol are already described above. Non-limiting examples of solvents include tetrahydrofuran (THF), acetonitrile, N,N-dimethylacetamide (DMAc), dimethyl sulfoxide (DMSO), N-methylpyrrolidone (NMP), propyleneglycol monomethylether acetate (PGMEA), ethyl acetate, methyl ethyl ketone (MEK), toluene, hexane, water, and mixtures thereof. The reaction can also be carried out in the presence of reacting alcohol alone, such as for example, methanol, ethanol, isopropanol, and the like. Mixtures of any of the foregoing solvents can also be used. The reaction can be carried out at suitable temperature including ambient, sub-ambient and super-ambient conditions. Typically, the reaction temperature employed is in the range of from about 40 to 120° C. and in certain embodiments the temperature can be in the range of 50 to 90° C. or from about 55 to 80° C. and in some other embodiments it can be in the range of 60 to 70° C.

The ROMA polymers so formed in accordance with this invention, depending upon contacting with such aforementioned reagents will cause either complete or partial ring open of the maleic anhydride repeating units to form a repeat unit of formula (IIA). Thus, such ROMA polymers may have a randomly ordered repeat units of formula (IA), (IB), (IIA), (IIB) and (IIIA), wherein the repeat units of formula (IIA) may include a combination of diacid (i.e., $R_7$ is hydrogen) or a monoester (i.e., $R_7$ is other than hydrogen) depending upon the degree of esterification with the alcohol. Thus in accordance with this aspect of the embodiment of this invention, the ring opened portion of the maleic anhydride repeat unit of formula (IIA) is in the order of from about 80 mole percent to about 100 mole percent; in some other embodiments it is higher than 90 mole percent; in some other embodiments it is higher than 95 mole percent; and in some other embodiments it is higher than 98 mole percent. In some other embodiments more than 99 mole percent of maleic anhydride units are ring opened. The amount of free acid present can be tailored by controlling the degree of esterification with an alcohol. Thus in one of the embodiments the amount of diacid present in the maleic anhydride repeat units of formula (IIA) is from about 0 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. That is to say, when 50 mole percent of the repeat unit of formula (IIA) is diacid, the remaining portions of the repeat units are esterified, thus portions of the repeat units is mono-esterified to give a cumulative total of 50% of the repeat units to be esterified. Accordingly, it should also be noted that it is possible that certain segments of the polymer chain may contain diesterified fully ring opened maleic anhydride repeat units. That is to say that in the repeat units of formula (IIA) the free acid is esterified and $R_7$ is not hydrogen.

Accordingly, the polymers employed in the compositions of this invention are therefore generally formed from the hydrolysis of the polymers containing the repeat units of formula (IA) and formula (IIB) along with repeat units of formula (IIIA) and (IVA), if present, (COMA), which after hydrolysis results in ring-opened polymers containing generally the repeat units of formula (IA) and (IIA), the ROMA polymers. The ROMA polymers as employed in this invention generally exhibit a weight average molecular weight ($M_w$) of at least about 20,000. In another embodiment, the polymer of this invention has a $M_w$ of at least about 30,000. In yet another embodiment, the polymer of this invention has a $M_w$ of at least about 40,000. In some other embodiments, the polymer of this invention has a $M_w$ of at least about 50,000. In some other embodiments, the polymer of this invention has a $M_w$ higher than 50,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Photoimagable Compositions

Thus, in accordance with the practice of this invention there is further provided a composition comprising:

a polymer comprising one or more distinct first repeating unit represented by formula (IA), each of said first repeating unit is derived from a monomer of formula (I):

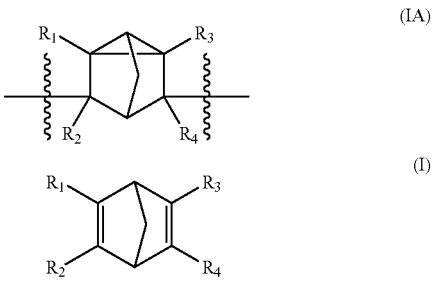

wherein:
$\sim\!\sim\!\sim$ represents a position at which the bonding takes place with another repeat unit;

each of $R_1$, $R_2$, $R_3$ and $R_4$ is independently selected from the group consisting of hydrogen, linear or branched ($C_1$-$C_{16}$)alkyl, hydroxy($C_1$-$C_{12}$)alkyl, perfluoro($C_1$-$C_{12}$)alkyl, ($C_6$-$C_{10}$)aryl($C_1$-$C_3$)alkyl, —$CO_2R$ and halogen; where R is ($C_1$-$C_6$)alkyl or tri(($C_1$-$C_6$)alkyl)silyl;

one or more distinct second repeating unit represented by formula (IIA), said second repeating unit is derived from a monomer of formula (II):

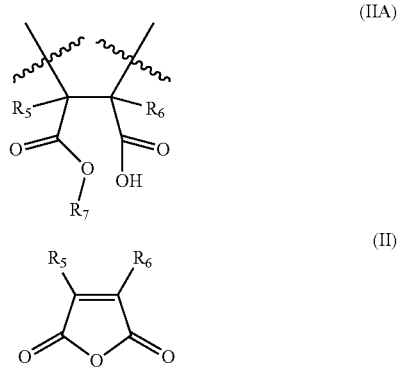

wherein:
each of $R_5$ and $R_6$ is independently selected from the group consisting of hydrogen, linear or branched ($C_1$-$C_9$) alkyl and fluorinated or perfluorinated($C_1$-$C_9$)alkyl;

$R_7$ is selected from the group consisting of hydrogen, linear or branched $(C_1\text{-}C_9)$alkyl, fluorinated or perfluorinated$(C_1\text{-}C_9)$alkyl, and —$(CH_2)_a$—$(O$—$(CH_2)_b)_c$—$O$—$(C_1\text{-}C_6)$alkyl, where a, b and c are integers from 1 to 4; and one or more distinct third repeating unit represented by formula (IIIA), said third repeating unit is derived from a monomer of formula (III):

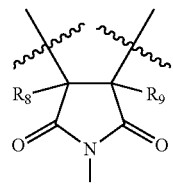

(IIIA)

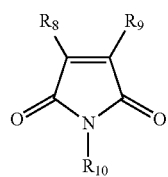

(III)

wherein:

each of $R_5$ and $R_9$ is independently selected from the group consisting of hydrogen, linear or branched $(C_1\text{-}C_9)$ alkyl and fluorinated or perfluorinated$(C_1\text{-}C_9)$alkyl;

$R_{10}$ is selected from the group consisting of hydrogen, linear or branched $(C_1\text{-}C_9)$alkyl, $(C_3\text{-}C_5)$cycloalkyl, $(C_3\text{-}C_9)$ cycloalkyl$(C_1\text{-}C_4)$alkyl, $(C_6\text{-}C_{10})$aryl and $(C_6\text{-}C_{10})$aryl$(C_1\text{-}C_4)$alkyl;

and wherein molar ratio of repeating unit of formula (IA) is substantially same as the combined molar ratios of repeating units of formulae (IIA) and (IIIA);

a photoactive compound;
a cross-linking agent; and
a carrier solvent.

Any of the polymers as described herein can be employed in the compositions of this invention.

In a further aspect of this invention there is also provided a composition comprising:

a polymer comprising one or more distinct first repeating unit represented by formula (IA), each of said first repeating unit is derived from a monomer of formula (I):

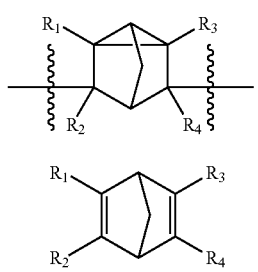

wherein:
 ~~ represents a position at which the bonding takes place with another repeat unit;

each of $R_1$, $R_2$, $R_3$ and $R_4$ is independently selected from the group consisting of hydrogen, linear or branched $(C_1$-$C_{16})$alkyl, hydroxy$(C_1\text{-}C_{12})$alkyl, perfluoro$(C_1\text{-}C_{12})$alkyl, $(C_6\text{-}C_{10})$aryl$(C_1\text{-}C_3)$alkyl, —$CO_2R$, halogen and a group of formula (A):

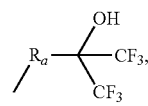

(A)

where R is $(C_1\text{-}C_6)$alkyl or tri$((C_1\text{-}C_6)$alkyl)silyl; and $R_a$ is selected from the group consisting of —$(CH_2)_p$—, —$(CH_2)_q$—$OCH_2$— and —$(CH_2)_q$—$(OCH_2CH_2)_r$—$OCH_2$—, where p is an integer from 0 to 6, q is an integer from 0 to 4 and r is an integer from 0 to 3; and one or more distinct second repeating unit represented by formula (IIA), said second repeating unit is derived from a monomer of formula (II):

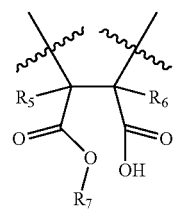

(IIA)

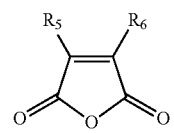

(II)

wherein:

each of $R_5$ and $R_6$ is independently selected from the group consisting of hydrogen, linear or branched $(C_1\text{-}C_9)$ alkyl and fluorinated or perfluorinated$(C_1\text{-}C_9)$alkyl;

$R_7$ is selected from the group consisting of linear or branched $(C_4\text{-}C_{16})$alkyl, fluorinated or perfluorinated$(C_1$-$C_{16})$alkyl, and —$(CH_2)_a$—$(O$—$(CH_2)_b)_c$—$O$—$(C_1\text{-}C_6)$ alkyl, where a, b and c are integers from 1 to 4; and a photoactive compound;
a cross-linking agent; and
a carrier solvent.

In this aspect of the invention the polymers that are employed in making the compositions are copolymers derived from norbornadiene monomers and maleic anhydride which is ring opened by a variety of alcohols as disclosed herein. Any of the copolymers as described herein which are within the scope of this aspect of the invention can be employed.

Exemplary copolymers which are suitable in this invention without any limitation include the following:

a copolymer of norbornadiene (NBD) and maleic anhydride in which maleic anhydride repeating unit is ring opened with n-decanol;

a copolymer of norbornadiene (NBD) and maleic anhydride in which maleic anhydride repeating unit is ring opened with n-butoxyethoxyethanol;

a copolymer of norbornadiene (NBD) and maleic anhydride in which maleic anhydride repeating unit is ring opened with n-dodecanol;

a copolymer of norbornadiene (NBD) and maleic anhydride in which maleic anhydride repeating unit is ring opened with n-hexyloxyethoxyethanol;

a copolymer of norbornadiene (NBD) and maleic anhydride in which maleic anhydride repeating unit is ring opened with octanol; and a copolymer of norbornadiene (NBD) and maleic anhydride in which maleic anhydride repeating unit is ring opened with methoxyethoxyethanol.

In yet another embodiment of this aspect of the invention, various ter- and tetrapolymers derived from the above noted copolymers and any one or more of the norbornene monomers as described herein can also be employed.

a terpolymer of norbornadiene (NBD), 5-((2-(2-methoxyethoxy)ethoxy)methyl)-bicyclo[2.2.1]hept-2-ene (NBTON) and maleic anhydride in which maleic anhydride repeating unit is ring opened with n-decanol;

a terpolymer of norbornadiene (NBD), 5-((2-(2-methoxyethoxy)ethoxy)methyl)-bicyclo[2.2.1]hept-2-ene (NBTON) and maleic anhydride in which maleic anhydride repeating unit is ring opened with n-butoxyethoxyethanol;

a terpolymer of norbornadiene (NBD), 5-((2-(2-methoxyethoxy)ethoxy)methyl)-bicyclo[2.2.1]hept-2-ene (NBTON) and maleic anhydride in which maleic anhydride repeating unit is ring opened with n-hexyloxyethoxyethanol;

a terpolymer of norbornadiene (NBD), norbornenyl-2-trifluoromethyl-3,3,3-trifluoropropan-2-ol (HFANB) and maleic anhydride in which maleic anhydride repeating unit is ring opened with octanol;

a terpolymer of norbornadiene (NBD), 5-((2-(2-methoxyethoxy)ethoxy)methyl)-bicyclo[2.2.1]hept-2-ene (NBTON) and maleic anhydride in which maleic anhydride repeating unit is ring opened with n-undecanol; and a tetrapolymer of norbornadiene (NBD), 5-((2-(2-methoxyethoxy)ethoxy)methyl)-bicyclo[2.2.1]hept-2-ene (NBTON), 5-phenethylbicyclo[2.2.1]hept-2-ene (PENB) and maleic anhydride in which maleic anhydride repeating unit is ring opened with methoxyethoxyethanol.

As mentioned above, the polymer compositions of this invention further contains a photoactive compound (PAC). Any of the PACs known to one skilled in the art which would bring about the desired results as further discussed herein can be employed in the composition of this invention. Broadly speaking, the PAC that can be employed in this invention is a photosensitive compound which when exposed to suitable radiation undergoes a chemical transformation such that the resulting product is generally more soluble in a developing solvent, such as for example, alkali solution thus facilitating the exposed regions to dissolve more readily than the unexposed regions. As noted, the composition of this invention further encompass an epoxy resin and a solvent. Further, such compositions are capable of forming films useful as self-imagable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imagable film, and such examples do not serve to limit the scope of such films or the polymers and polymer compositions that are used to form them.

Generally, the PACs that are suitable in this invention contain a diazo-quinone group of formula (B):

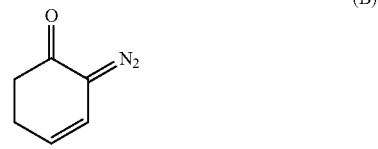

Non-limiting examples of such a photoactive compound (PAC) can include a group, such as, 1,2-naphthoquinonediazide-5-sulfonyl moiety and/or a 1,2-naphthoquinonediazide-4-sulfonyl moiety as represented by structural formulae (Va) and (Vb), respectively:

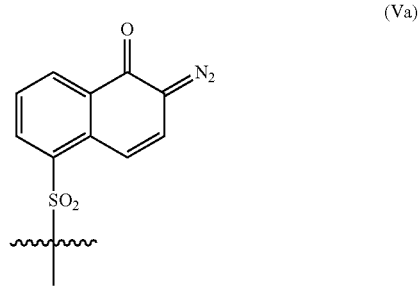

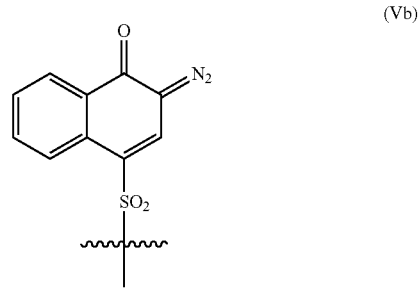

Other such photoactive moieties, among others, include sulfonyl benzoquinone diazide group represented by structural formula (Vc):

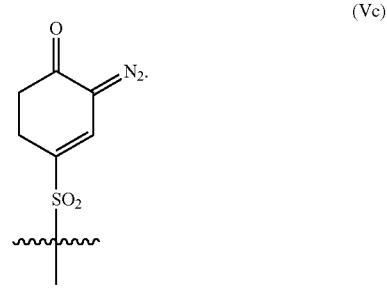

Generally, the functional groups of formulae (Va), (Vb) and/or (Vc) are incorporated into the photosensitive composition as an esterification product of the respective sulfonyl chloride (or other reactive moiety) and a phenolic compound, such as one or more of the exemplary compounds represented below collectively as structural formulae (VIa) to (VIag). Thus, any one, or any mixture of two or more of such esterification products are combined with the resin in forming the photosensitive resin compositions of the present invention. In the formulae (VIa) to (VIag) below, Q may represent any of the structures (Va), (Vb) or (Vc). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 1 to 50 parts by weight material to 100 parts by weight resin. Where the specific ratio of the photosensitive material to resin is a function of the dissolution rate of exposed portions as compared to unexposed portions and the amount of radiation required to achieve a desired dissolution rate differential.

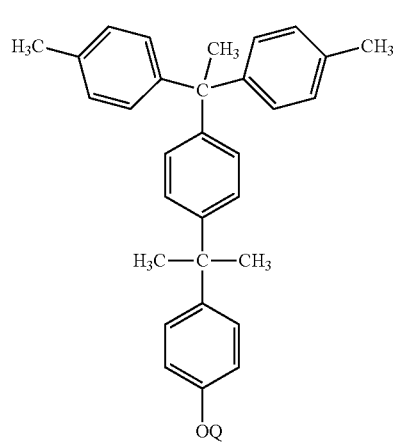 (VIa)

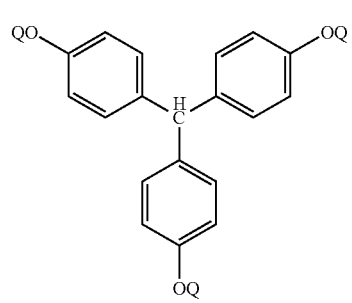 (VIb)

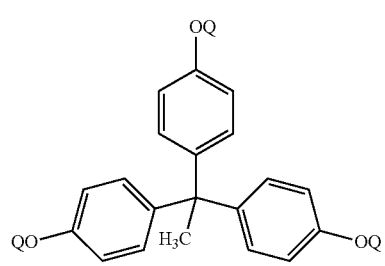 (VIc)

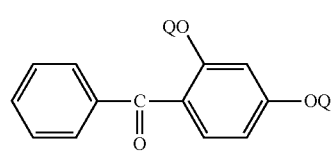 (VId)

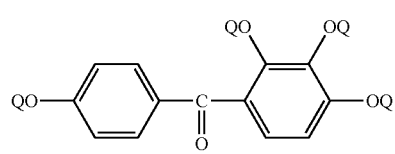 (VIe)

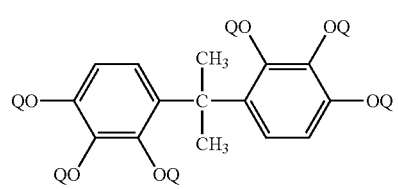 (VIf)

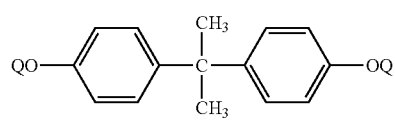 (VIg)

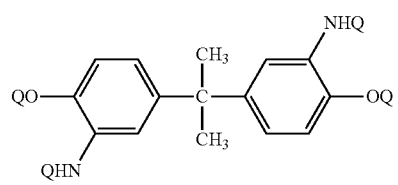 (VIh)

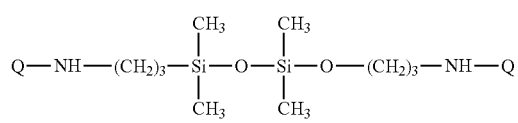 (VIi)

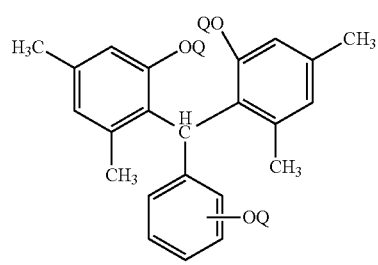 (VIj)

-continued
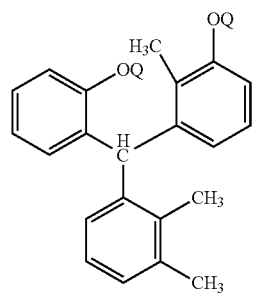 (VIk)
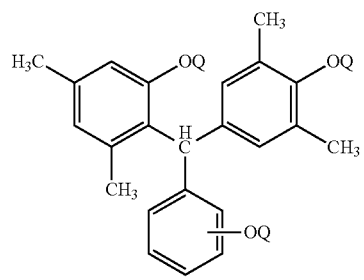 (VIl)
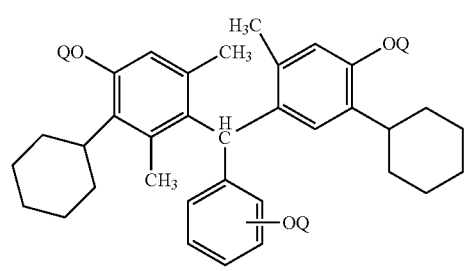 (VIm)
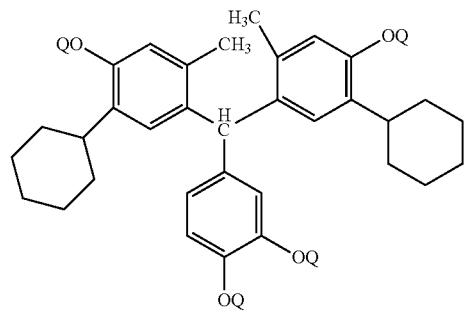 (VIn)
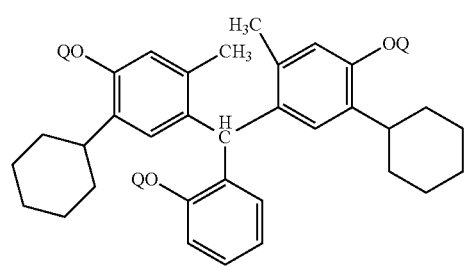 (VIo)
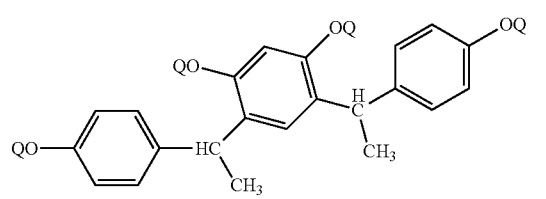 (VIp)
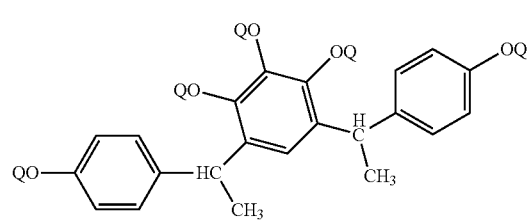 (VIq)
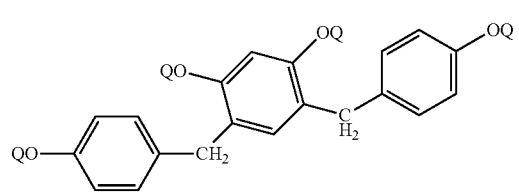 (VIr)
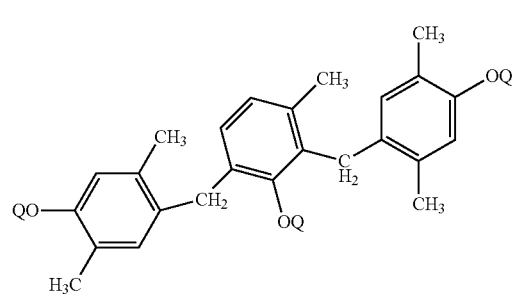 (VIs)
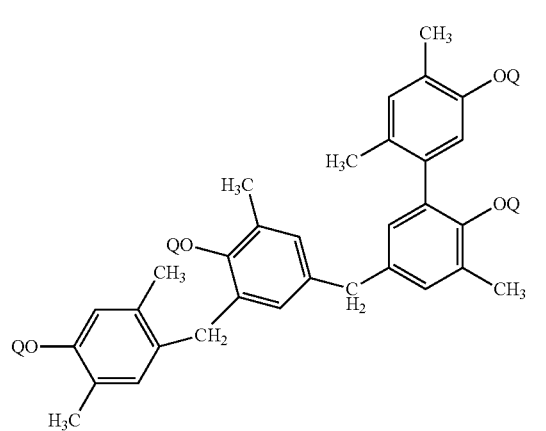 (VIt)

-continued
(VIu) 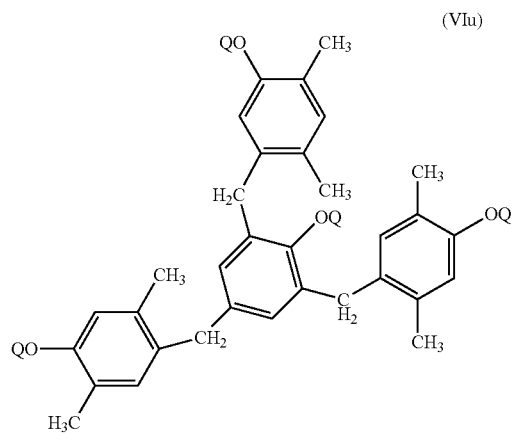
(VIv) 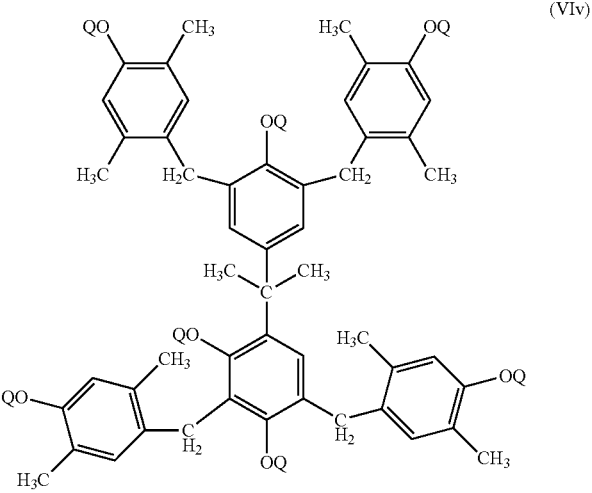
(VIw) 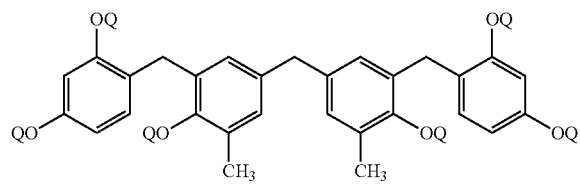
(VIx) 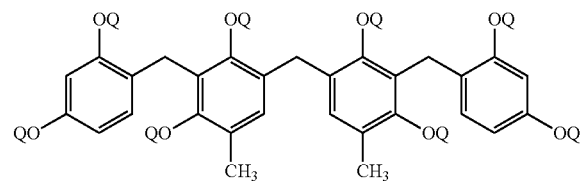
(VIy) 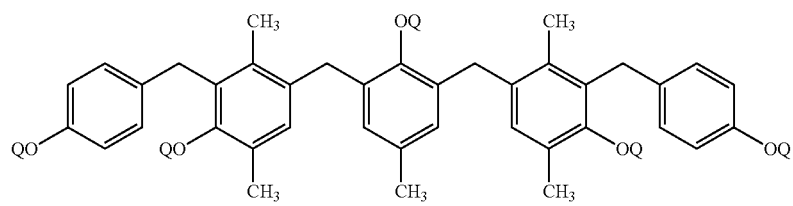
(VIz) 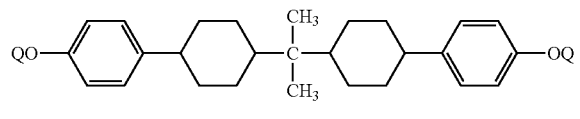
(VIaa) 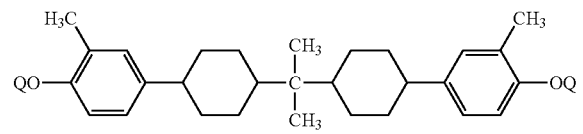
(VIab) 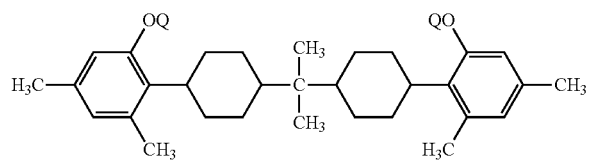
(VIac) 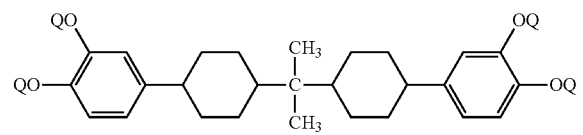
(VIad) 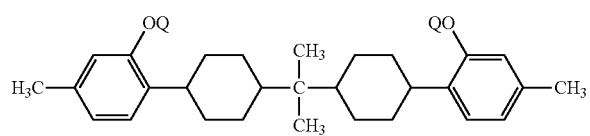
(VIae) 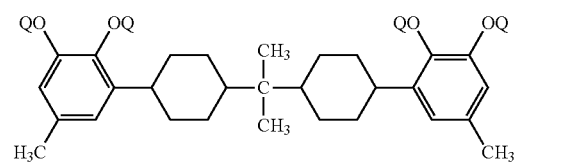

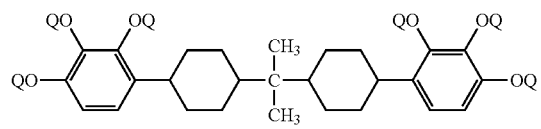
(VIaf)

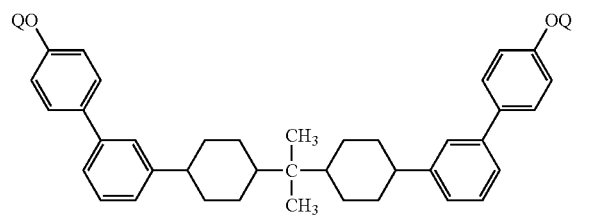
(VIag)

In the above listed PACs of formulae (VIa) to (VIag), Q refers to any one of photoactive moieties of formulae (Va), (Vb) or (Vc) or hydrogen, but at least one of these Q in each of these structures is (Va), (Vb) or (Vc). Several of the PACs listed above are commercially available. For example, PAC-5570 of formula (VIc) (St. Jean Photochemicals Inc., Quebec, Canada), SCL6 of formula (VId) (Secant Chemicals Inc., Winchendon, Mass., USA), Tris-P 3M6C-2-201 of formula (VIo) (also referred to herein as TrisP), collectively TS-200, TS-250 and TS-300 of formula (VIa), and 4NT-300 of formula (VIe) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen. Again, Q in each of these instances refers to one of group (Va), (Vb) or (Vc).

The amount of PACs incorporated into the polymer compositions depends upon the type of polymer used and to the dosage level of the exposure contemplated. The amount can vary generally from about 5 to 50 parts per 100 parts by weight of the polymer and typically from about 10 to about 30 parts by weight, although other advantageous amounts of such materials are also appropriate and within the scope of the present invention.

Exemplary epoxies and other cross-linking additives, as mentioned above, include, but are not limited to, bisphenol A epoxy resin (LX-1—Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis (methylene))bis(oxirane) (Techmore VG3101L—Mitsui Chemical Inc.), trimethylolpropane triglycidylether (TMPTGE-CVC Specialty Chemicals, Inc.), and 1,1,3,3,5,5-hexamethyl-1,5-bis(3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl)methane (EPON™ 862, Hexion Specialty Chemicals, Inc.), triglycidyl ether of poly (oxypropylene)epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

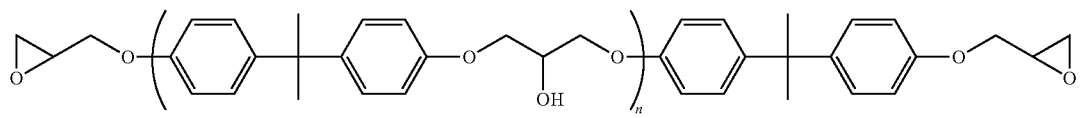
LX-01, where n is from 1 to 5

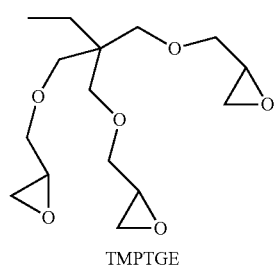
TMPTGE

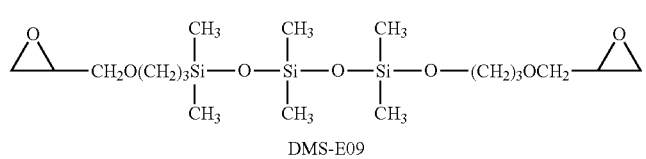
DMS-E09

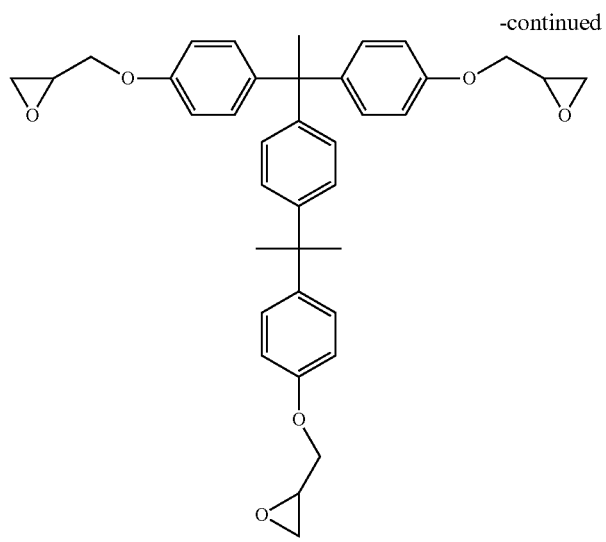

Techmore VG3101L

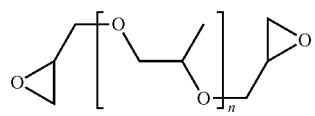

D.E.R.™ 732, where n = 8 to 10 and
D.E.R.™ 736, where n = 4 to 6

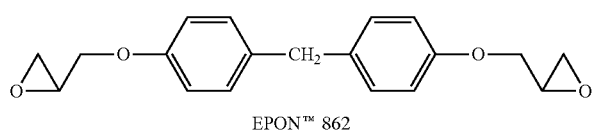

EPON™ 862

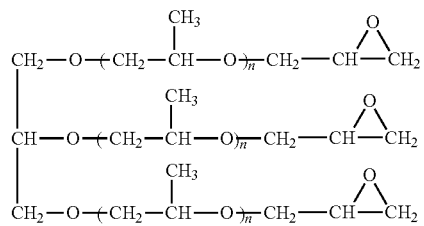

triglycidyl ether of poly(oxypropylene)epoxide ether of glycerol, where n is from 6 to 10, commercially available as Heloxy 84 or GE-36 from Momentive Specialty Chemicals Inc.;

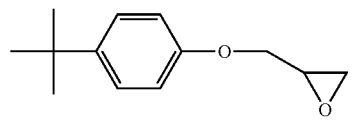

2-((4-(tert-butyl)phenoxy)methyl)oxirane, commercially available as Heloxy 65 from Momentive Specialty Chemicals Inc.; and

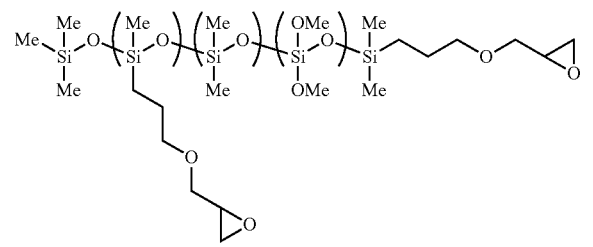

Silicone modified epoxy compound commercially available as BY16-115 from Toray-Dow Corning Silicone Co., Ltd.

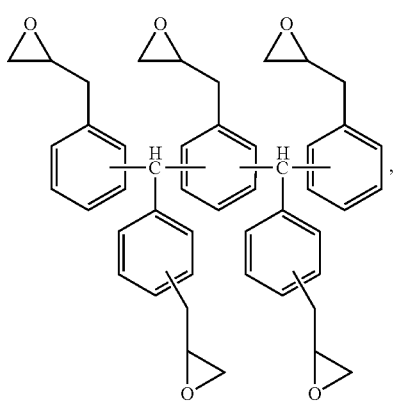

JER1032H60 available from Nippon Kayaku Co., Ltd.

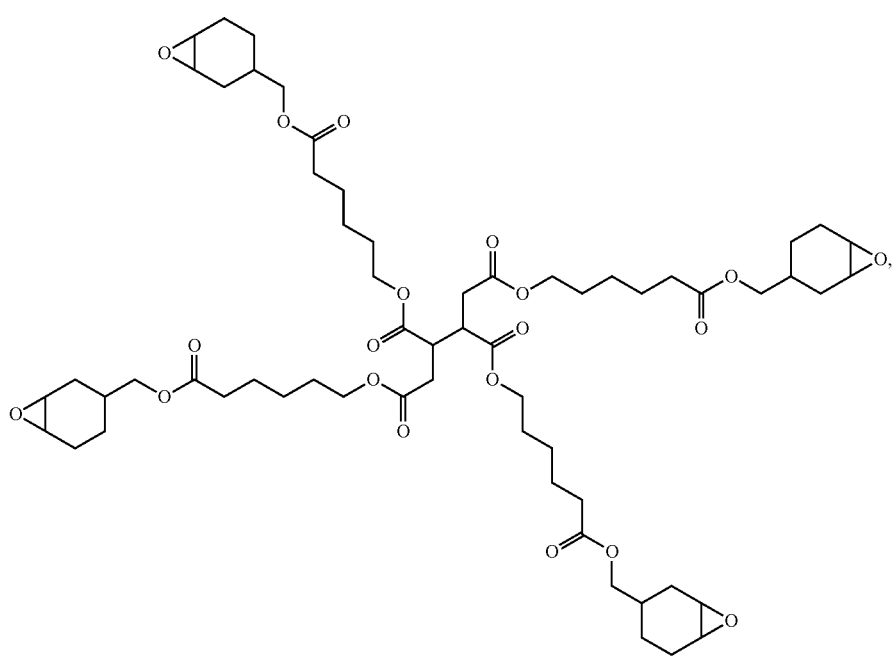

GT-401 available from Daicel Corp.

Other cross-linking agents that can be used in the compositions of this invention include the following:

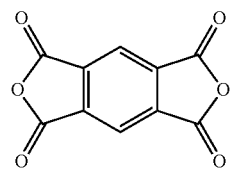

1H,3H-benzo[1,2-c:4,5-c′]difuran-1,3,5,7-tetraone (PMDA), available from Aldrich

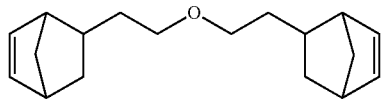

5,5′-(oxybis(ethane-2,1-diyl))bis(bicyclo[2.2.1]hept-2-ene) (NBEtOEtNB)

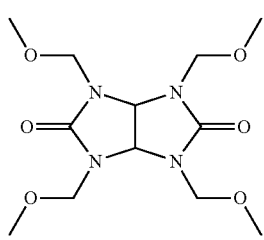

Powderlink 1174, available from Cytec, 1,3,4,6-tetrakis(methoxymethyl)tetrahydroimidazo[4,5-d]imidazole-2,5(1H,3H)-dione -continued

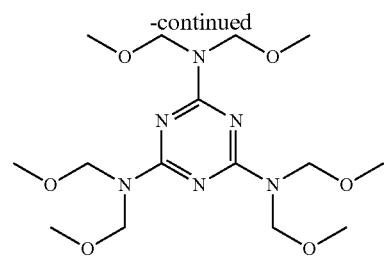

N2,N2,N4,N4,N6,N6-hexakis(methoxymethyl)-1,3,5-triazine-2,4,6-triamine, Cymel 1170, available from Cytec

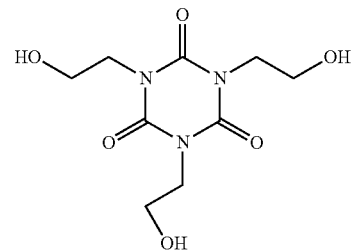

1,3,5-tris(2-hydroxyethyl)-1,3,5-triazinane-2,4,6-trione, THETATO, available from Aldrich

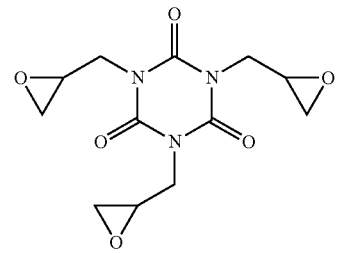

1,3,5-tris(oxiran-2-ylmethyl)-1,3,5-triazinane-2,4,6-trione, TOTATO, available from Aldrich

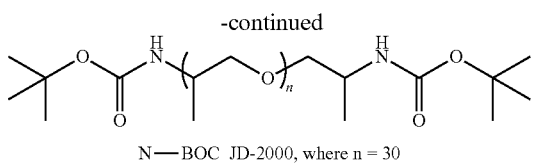

N—BOC JD-2000, where n = 30

Still other exemplary epoxy resins or cross-linking additives include, among others Araldite MTO163 and Araldite CY179 (manufactured by Ciba Geigy); and EHPE-3150, Epolite GT300 and (manufactured by Daicel Chemical).

The amount of epoxy compound may also vary as noted for PACs depending upon the base polymer employed in the composition and the amount can also vary depending upon the intended result. The amount can vary generally from about 1 to 50 parts by weight per 100 parts of the polymer and typically from about 2 to about 30 parts by weight, although other advantageous amounts of such materials are also appropriate and within the scope of the present invention. In addition, one or more different types of epoxy compounds as enumerated herein can be used in the composition of this invention and the amounts of each can thus be varied as needed.

Advantageously, it has now been found that polymer compositions of this invention provide several desirable properties especially when compared to several of the polymers reported in the literature for similar applications. For instance, it has been observed that several of the polymers as described herein exhibit very low dark field loss (DFL) making them more desirable for positive tone (PT) applications. As used herein, the term DFL or the unexposed area film thickness loss is a measure of the film thickness loss after image-wise exposure to suitable actinic radiation and developing in a suitable developer. That is, the polymer compositions of this invention are cast into films, the film thicknesses before and after development in an unexposed region of the film are measured and reported as percent loss of the film thickness in areas of the film that was not exposed to the radiation. Generally, higher the percent of DFL, poorer the performance of the polymer composition, which means that the unexposed areas of the film are more susceptible to the developed and thus dissolves in the developer. In addition, the measured DFL also depends on the developed time employed. Generally, longer the develop time higher the DFL.

Surprisingly, the compositions of this invention exhibit very low DFL in that the unexposed area of the film is not lost even at higher develop time. Accordingly, in some embodiments of this invention the DFL of the compositions may be less than about 20 percent; in some other embodiments DFL can be less than 25 percent; and in some other embodiments the DFL may be in the range of from about 0 percent to 30 percent. At the same time the develop time for the compositions of this invention can generally range from about 10 seconds to about 80 seconds; in some other embodiments the develop time can range from about 20 seconds to about 60 seconds; and in some other embodiments the develop time can range from about 30 seconds to about 40 seconds.

In addition, advantageously it has also been found that the compositions of this invention exhibit excellent dissolution rate in the developing solvent, such as for example, aqueous based alkali developer, including tetramethylammonium hydroxide (TMAH), among other known aqueous developers. This can further be tailored based on the molar content of the free carboxylic acid group present in the maleic repeat units of formula (IIA) in the polymer. Generally, it has now been found that by judicious selection of the molar ratio of ring opened maleic anhydride repeat units it is now possible to control the dissolution rate of the composition of this invention to the desirable range. Furthermore, the compositions of this invention retain much needed lithographic resolution, photospeed and high degree of chemical resistance, among various other desirable properties.

More advantageously and surprisingly, it has also been found that the compositions of this invention exhibit improved thermomechanical properties. For instance, the compositions of this invention exhibit very high thermal stability, i.e., higher than 300° C. Therefore, the compositions of this invention can be employed in applications where such high temperature stabilities are required as further demonstrated by specific examples that follow. In addition, the compositions of this invention also exhibit excellent mechanical properties and form high resolution images after "image-wise" exposed to suitable actinic radiation.

In addition, various other additives/components can be added to the composition of this invention, which is used for the formation of the photoimagable layer such that its mechanical and other properties can be tailored as desired. Also, other additives can be used to alter the processability, which include increase the stability of the polymer to thermal and/or light radiation. In this regard, the additives can include, but are not limited to, crosslinkers, photosensitizers, antioxidants, adhesion promoters, surfactants, thermal acid and/or thermal base generator, such as CXC 1761 from King Industries, Inc., photo acid and/or photo base generator, catalyst scavengers, stabilizers, reactive diluents, and the like. Any of these additives can be used as a mixture in any combination thereof.

Advantageously, it has now been found that use of a base generator, such as a thermal base generator (TBG) or a photo base generator (PBG) improves generally overall performance of the composition of this invention, such as for example, shelf-life and thermomechanical properties of the cured films obtained therefrom as evidenced from the specific examples described hereinbelow. Accordingly, in some embodiments of this invention the compositions of this invention encompasses one or more PBG. In some other embodiments of this invention the composition of this invention encompasses one or more thermal base generators. Any of the known TBG or PBG in an appropriate amount can be employed in the composition of this invention which will bring about the intended change. The amount of TBG and/or PBG employed can vary generally from about 1 to 20 parts by weight per 100 parts of the polymer and typically from about 2 to about 10 parts by weight, although other advantageous amounts of such materials are also appropriate and within the scope of the present invention. In addition, as noted, one or more different types of PBG and/or TBG can be used in the composition of this invention and the amounts of each can thus be varied as needed.

Representative examples of TBGs and/or PBGs that can be used in the compositions of this invention without any limitation are enumerated below:

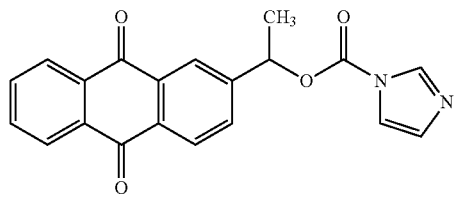 [SMILES: CC(OC(=O)n1ccnc1)c1ccc2c(c1)C(=O)c1ccccc1C2=O]

1-(9,10-dioxo-9,10-dihydroanthracen-2-yl)ethyl 1H-imidazole-1-carboxylate, commercially available as WPBG-140 from Wako Specialty Chemicals;

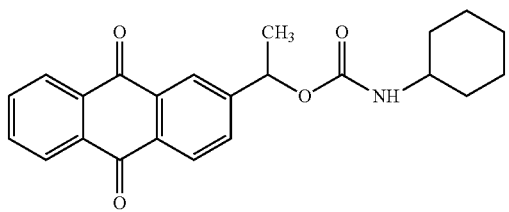 [SMILES: CC(OC(=O)NC1CCCCC1)c1ccc2c(c1)C(=O)c1ccccc1C2=O]

1-(9,10-dioxo-9,10-dihydroanthracen-2-yl)ethyl cyclohexylcarbamate, commercially available as WPBG-174 from Wako Specialty Chemicals;

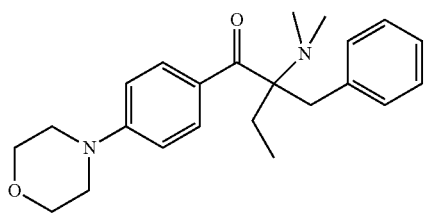 [SMILES: CCC(Cc1ccccc1)(C(=O)c1ccc(N2CCOCC2)cc1)N(C)C]

2-benzyl-2-(dimethylamino)-1-(4-morpholinophenyl)butan-1-one, commercially available as Irgacure-369 from BASF; and

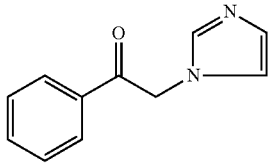 [SMILES: O=C(Cn1ccnc1)c1ccccc1]

2-(1H-imidazol-1-yl)-1-phenylethan-1-one.

In some embodiments of the composition of this invention the epoxies that can be used in the composition of this invention without any limitation is selected from the group consisting of:
triglycidyl ether of poly(oxypropylene)epoxide ether of glycerol (GE-36);
trimethylolpropane triglycidylether;
bisphenol A epichlorohydrin based epoxy resin;
polypropylene glycol epichlorohydrin based epoxy resin (D.E.R.™ 732);
bis(4-(oxiran-2-ylmethoxy)phenyl)methane (EPON 862);
glycidyl ether of para-tertiary butyl phenol (Heloxy 65);
polyethylene glycol diglycidyl ether (PEGDGE);
2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane) (VG3101L); and
polypropylene glycol diglycidyl ether (PPGDGE);
and a mixture in any combination thereof.

The polymer compositions in accordance with the present invention may further contain optional components as may be useful for the purpose of improving properties of both the composition and the resulting layer, for example the sensitivity of the composition to a desired wavelength of exposure radiation. Examples of such optional components include various additives such as a dissolution promoter, a surfactant, a silane coupling agent, a leveling agent, an antioxidant, a fire retardant, a plasticizer, a crosslinking agent or the like. Such additives include, but are not limited to, bisphenol A and 5-norbornene-2,3-dicarboxylic acid as a dissolution promoter, a silicone surfactant such as TSF4452 (Toshiba Silicone Co., Ltd) or any other suitable surfactant such as Megaface F-556, a nonionic or anionic fluorinated oligomer with hydrophilic and lipophilic group from DIC Corp. a silane coupling agent such as γ-aminopropyl triethoxysilane, a leveling agent, such as γ-(methacryloyloxy propyl) trimethoxysilane or FC-4432, 2-propenoic acid, 2-[methyl[(nonafluorobutyl)sulfonyl]amino]ethyl ester, telomer with methyloxirane polymer with oxirane di-2-propenoate and methyloxirane polymer with oxirane monopropenoate from DIC, antioxidants such as pentaerythritol tetrakis(3-(3,5-di-tert-butyl-4-hydroxyphenyl)propionate) (IRGANOX™ 1010 from BASF), 3,5-bis(1,1-dimethylethyl)-4-hydroxy-octadecyl ester benzenepropanoic acid (IRGANOX™ 1076 from BASF) and thiodiethylene bis[3-(3,5-di-tert.-butyl-4-hydroxy-phenyl)propionate] (IRGANOX™ 1035 from BASF), a fire retardant such as a trialkyl phosphate or other organic phosphoric compound and a plasticizer such as, poly(propylene glycol).

Non-limiting examples of aforementioned various other additives/components are selected from the group consisting of the following, commercially available materials are indicated by such commercial names.

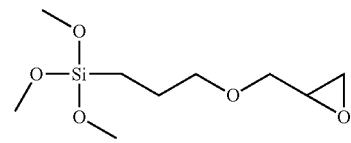

trimethoxy(3-(oxiran-2-ylmethoxy)propyl)silane, also commonly known as 3-glycidoxypropyl trimethoxysilane (KBM-403E from Shin-Etsu Chemical Co., Ltd.);

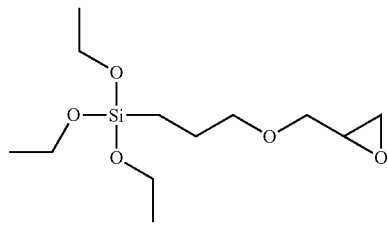 [SMILES: CCO[Si](CCCOCC1CO1)(OCC)OCC]

triethoxy(3-(oxiran-2-ylmethoxy)propyl)silane, also commonly known as 3-glycidoxypropyl triethoxysilane (KBE-403 from Shin-Etsu Chemical Co., Ltd.);

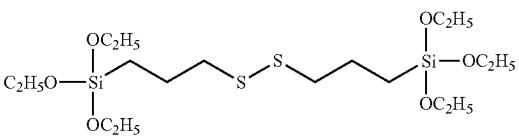

((triethoxysilyl)propyl)disulfide (Si-75 or Si-266 from Evonik);

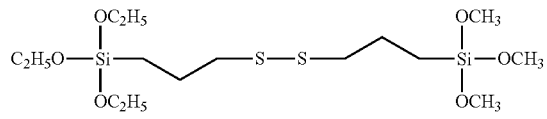

((trimethoxysilyl)propyl)disulfide;

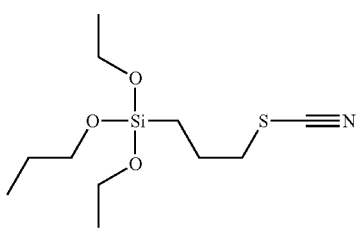 [SMILES: CCCO[Si](CCCSC#N)(OCC)OCC]

diethoxy(propoxy)(3-thiocyanatopropyl)silane, commercially available as SIT-7908.0 from Gelest;

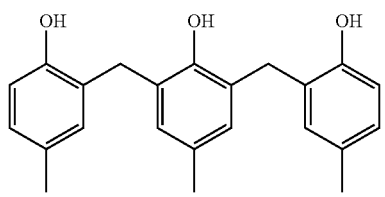 [SMILES: Cc1ccc(O)c(Cc2cc(C)cc(Cc3cc(C)ccc3O)c2O)c1]

2,2'-((2-hydroxy-5-methyl-1,3-phenylene)bis(methylene))bis(4-methylphenol) (AO-80 from TCI Japan);

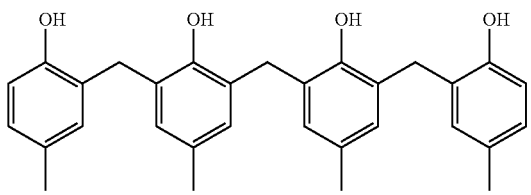 [SMILES: Cc1ccc(O)c(Cc2cc(C)cc(Cc3cc(C)cc(Cc4cc(C)ccc4O)c3O)c2O)c1]

6,6'-methylenebis(2-(2-hydroxy-5-methylbenzyl)-4-methylphenol) (4-PC);

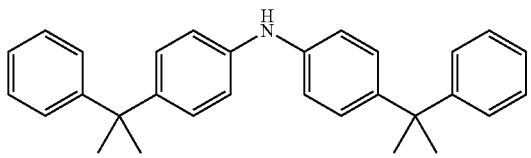 [SMILES: CC(C)(c1ccccc1)c1ccc(Nc2ccc(C(C)(C)c3ccccc3)cc2)cc1]

bis(4-(2-phenylpropan-2-yl)phenyl)amine, commercially available as Naugard-445 from Addivant;

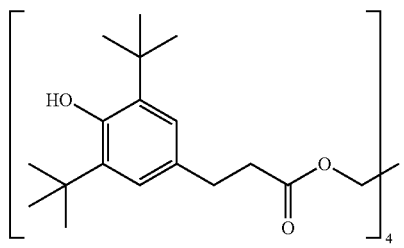

pentaerythritol tetrakis(3-(3,5-di-tert-butyl-4-hydroxyphenyl)propionate) (Irganox 1010 from BASF);

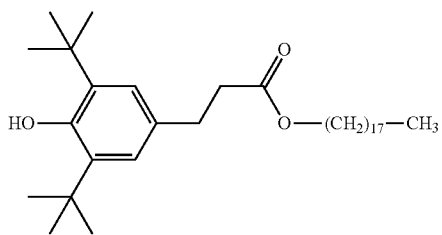

3,5-bis(1,1-dimethylethyl)-4-hydroxy-octadecyl ester benzenepropanoic acid (Irganox 1076 from BASF); and

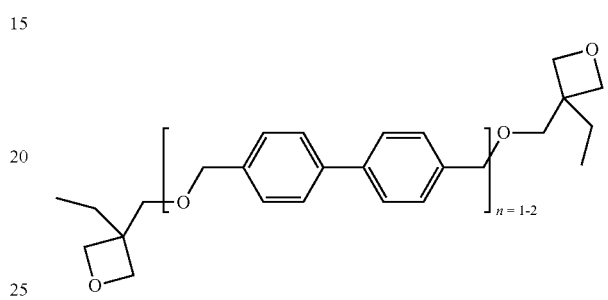

3,3'-[[1,1'-biphenyl]-4,4'-diylbis(methyleneoxymethylene)]bis[3-ethyl-oxetane

In the embodiments of the present invention, these components are generally dissolved in a solvent and prepared into a varnish form to be used. As a solvent, there may be used N-methyl-2-pyrrolidone (NMP), γ-butyrolactone (GBL), N,N-dimethylacetamide (DMAc), dimethylsulfoxide (DMSO), diethyleneglycol dimethyl ether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methyl ethyl ketone (MEK), methyl amyl ketone (MAK), cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate or the like. They may be used solely or mixed by optionally selecting two or more kinds.

In one embodiment of the composition of this invention, the solvent used in forming the composition is selected form the group consisting of propyleneglycol monomethylether acetate (PGMEA), gamma-butyrolactone (GBL) and N-methylpyrrolidone (NMP) and a mixture in any combination thereof.

As mentioned above, some embodiments of the present invention encompass structures, such as optoelectronic structures, which include at least one self-imagable layer formed from a film of a polymer composition embodiment in accordance with the present invention.

The aforementioned structure embodiments of the present invention are readily formed by first casting or applying a polymer composition over an appropriate substrate to form a layer or a film thereof, then heating the substrate to an appropriate temperature for an appropriate time, where such time and temperature are sufficient to remove essentially all of the casting solvent of such composition. After such first heating, the layer is image-wise exposed to an appropriate wavelength of actinic radiation. As described hereinabove, the aforementioned image-wise exposure causes the PAC contained in the exposed portions of the layer to undergo a chemical reaction to form a free acid that enhances the dissolution rate of such exposed portions to an aqueous base solution (generally a solution of tetramethylammonium hydroxide (TMAH)). In this manner, such exposed portions are removed and unexposed portions remain. Next a second heating is performed to cause ring closure of the portions of the polymer and/or cross-linking with the epoxy additive, if present, thus essentially "curing" the polymer of such unexposed portions to form an aforementioned structure embodiment of the present invention.

It should be noted again that the second heating step, post development bake/curing is performed for the imaged and developed layer. In this step of second heating, the thermal curing of the polymer layer can be achieved with the added additives, such as epoxies and/or other crosslinking agents as described herein.

Accordingly, there is further provided a cured product obtained by curing the composition of this invention as described herein. In a further embodiment of this invention there is also provided an optoelectronic or microelectronic device encompassing the cured product of this invention, which is having a dielectric constant of 3.2 or less at 1 MHz.

The following examples, without being limiting in nature, illustrate methods for making composition embodiments in accordance with the present invention.

It should further be noted that the following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention.

EXAMPLES (GENERAL)

The following definitions have been used in the Examples that follow unless otherwise indicated:
NBD: norbornadiene; MA: maleic anhydride; MI: maleimide; N-CyHexMI: N-cyclohexylmaleimide; N-PhMI: N-phenylmaleimide; NB: norbornene; NBTON: 5-((2-(2-methoxyethoxy)ethoxy)methyl)bicyclo[2.2.1]hept-2-ene; TrisP3M6C-2-201: a PAC of formula (VIo) in which Q is of formula (Va); TMPTGE: trimethylolpropane triglycidylether; VG3101L: 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane); GE-36: triglycidyl ether of poly(oxypropylene)epoxide ether of glycerol; Heloxy 505: castor oil poly glycidyl ether; GT-401: an epoxy crosslinker; JER1032H60: an epoxy crosslinker; THETATO: 1,3,5-tris(2-hydroxyethyl)-1,3,5-triazinane-2,4,6-trione; TOTATO: 1,3,5-tris(oxiran-2-ylmethyl)-1,3,5-triazinane-2,4,6-trione; Powderlink 1174: 1,3,4,6-tetrakis(methoxymethyl)tetrahydroimidazo[4,5-d]imidazole-2,5(1H,3H)-dione; N—BOC JD-2000; BY16-115: Silicone modified epoxy compound; PMDA: 1H,3H-benzo[1,2-c:4,5-c']difuran-1,3,5,7-tetraone; CXC 1614: acid catalyst from King Industries Inc.; CXC 1761: thermal base catalyst from King Industries Inc.; WPBG-174: 1-(9,10-dioxo-9,10-dihydroanthracen-2-yl)ethyl cyclohexylcarbamate; KBM-403E: trimethoxy(3-(oxiran-2-ylmethoxy)propyl)silane, also commonly known as 3-glycidoxypropyl trimethoxysilane; FC-4432: a fluoro-surfactant-2-propenoic acid, 2-[methyl[(nonafluorobutyl)sulfonyl]amino]ethyl ester, telomer with methyloxirane polymer with oxirane di-2-propenoate and methyloxirane polymer with oxirane mono-propenoate; Cymel 1170: N2,N2,N4,N4,N6,N6-hexakis(methoxymethyl)-1,3,5-triazine-2,4,6-triamine; THF: Tetrahydrofuran; DMAc: N, N-dimethylacetamide; DMSO: dimethylsulfoxide; NMP: N-methyl-2-pyrrolidone; GBL: γ-butyrolactone; GPC: high performance liquid chromatography; GPC: gel permeation chromatography; $M_w$: weight average molecular weight; $M_n$: number average molecular weight; PDI: polydispersity index; pphr: parts per hundred resin; FT-IR: Fourier transform-infrared; NMR: nuclear magnetic resonance; TGA: thermogravimetric analysis.

Polymers

The polymers used to form the photosensitive compositions of this invention are prepared generally in accordance with the well-known literature procedures. See for example, the U.S. Pat. No. 8,715,900, pertinent portions of which are incorporated herein by reference. The following examples are further provided to illustrate the preparation of the COMA and ROMA polymers as described herein.

Example 1

Terpolymer of NBD/MA/N-PhMI

Maleic anhydride (MA, 4.9 g, 50 mmol), N-phenyl maleimide (N-PhMI, 7.45 g, 43 mmol) and 2,5-norbornadiene (NBD, 9.2 g, 100 mmol) were dissolved in toluene (67 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (0.8 g, 2 mmol) was then added and the mixture was allowed to stir at 65-70° C. for 5 hrs, after which the solution was cooled to room temperature. The solid polymer was separated out of the solution and washed with excess heptanes, filtered and dried in a vacuum oven at 80° C. for 20 hrs. Approximately 18 g (84% yield) of the NBD/N-PhMI/MA polymer was isolated (GPC (DMAc) $M_w$=52,350, $M_n$=15,400, PDI=3.4). $^{13}$C-NMR characterization of the polymer in deuterated DMSO showed peaks at 10-20 ppm for the presence of cyclopropane structure and two peaks at about 170-180 ppm for the presence of the carbonyl group of the cyclic anhydride structures from both MA and N-PhMI (i.e., repeat units of formulae (IIB) and (IIIA) respectively). FT-IR characterization of the polymer showed peaks at 1860 cm$^{-1}$ and 1781 cm$^{-1}$ for the presence of the carbonyl group of cyclic anhydride structure from MA and at 1712 cm$^{-1}$ for the carbonyl group of cyclic anhydride structure from N-PhMI. The composition of the polymer is estimated to be 42/30/28 of NBD/N-PhMI/MA based on $^1$H and $^{13}$C-NMR data. Based on the $^1$H and $^{13}$C-NMR data it was further determined that of the 42 mol % of the NBD repeat units 37 mol % are due to repeat units of formula (IA) and 5 mol % are due to repeat units of formula (IB).

Example 2

Terpolymer of NBD/MA/MI

Maleic anhydride (MA, 10.3 g, 105 mmol), maleimide (MI, 4.4 g, 45 mmol) and 2,5-norbornadiene (NBD, 13.8 g, 150 mmol) were dissolved in toluene (69.2 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (1.2 g, 3 mmol) was then added and the mixture was allowed to stir at 65-70° C. for 5 hrs, after which the solution was cooled to room temperature. The solid polymer was separated out of the solution and washed with excess heptanes, filtered and dried in a vacuum oven at 80° C. for 20 hrs. Approximately 23.6 g (83% yield) of the NBD/MI/MA polymer was isolated (GPC (DMAc) $M_w$=43,200, $M_n$=19,000, PDI=2.27). $^{13}$C-NMR characterization of the polymer in deuterated DMSO showed peaks at 10-20 ppm for the presence of cyclopropane structure and a peak at about 175 ppm for the presence of carbonyl group of the cyclic anhydride structure from MA and a peak at about 180 ppm for carbonyl group of cyclic anhydride structure from MI. FT-IR characterization of the polymer showed peaks at 1859 cm$^{-1}$ and 1775 cm$^{-1}$ for the presence of the carbonyl group of the cyclic anhydride structure from MA and at 1719 cm$^{-1}$ for the carbonyl group of the cyclic imide structure from MI, i.e., respectively formulae (IIB) and (IIIA) as described herein. The composition of the polymer is estimated to be 38/13/49 of NBD/MI/MA based on $^{13}$C-NMR data.

Example 3

Tetrapolymer of NBD/NBTON/N-PhMI/MA

Maleic anhydride (MA, 9.8 g, 100 mmol), N-PhMI maleimide (N-PHMI, 14.9 g, 86 mmol), NBTON (13.6 g, 60 mmol) and 2,5-norbornadiene (NBD, 12.9 g, 140 mmol) were dissolved in cyclopentanone (122.1 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (1.2 g, 3 mmol) was then added and the mixture was allowed to stir at 65-70° C. for 5 hrs, after which the solution was cooled to room temperature. Some solvent had evaporated during this time while cooling to room temperature. Toluene (75 g) and tetrahydrofuran (THF, 50 g) were added to obtain about 205 g of the polymer solution. The polymer was precipitated from about 25 g of this polymer solution by adding into excess heptanes, filtered and dried in a vacuum oven at 80° C. for 20 hrs. Approximately 3.2 g (62% yield) of the NBD/NBTON/N-PhMI/MA polymer was isolated (GPC (DMAc) $M_w$=22,500, $M_n$=14,100, PDI=1.6). $^{13}$C-NMR characterization of the polymer in deuterated DMSO showed peaks at 10-20 ppm for the presence of cyclopropane structure and peaks at about 170-180 ppm for the presence of carbonyl groups of cyclic anhydride structure from MA and N-PhMI. Peaks at 125-150 ppm showed the presence of aromatic carbons from N-PhMI. Three peaks at 68-76 ppm showed the presence of carbon from —CH$_2$O— groups from NBTON. FT-IR characterization of the polymer showed peaks at 1859 cm$^{-1}$ and 1779 cm$^{-1}$ for the presence of the carbonyl groups of cyclic anhydride structure from MA and at 1712 cm$^{-1}$ for the carbonyl groups cyclic anhydride structure from N-PhMI. The composition of the polymer is estimated to be 33/10/33/24 of NBD/NBTON/N-PhMI/MA based on $^{13}$C-NMR data.

Example 4

Terpolymer of NBD/N-CyHexMI/MA

Maleic anhydride (MA, 24.5 g, 250 mmol), N-Cyclohexyl maleimide (N-CyHexMI, 44.75 g, 250 mmol) and 2,5-norbornadiene (NBD, 46 g, 500 mmol) were dissolved in cyclopentanone (238 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (1 g, 2.5 mmol) was then added and the mixture was allowed to stir for 5 mins during which time the temperature of the reaction mixture increased by about 3° C. Additional amounts of lauryl peroxide (1 g, 2.5 mmol) were added, the temperature of the reaction mixture increased by about 10° C. in about 9 minutes and the mixture was allowed to stir at 65-70° C. for 5 hrs, after which the solution was cooled to room temperature. About 320 g of the polymer solution was mixed with THF (50 g). The polymer was precipitated from about 10 g of this polymer solution by adding into excess heptanes, filtered and dried in a vacuum oven at 80° C. for 20 hrs. Approximately 2.5 g (80% yield) of the NBD/N-CyHexMI/MA polymer was isolated (GPC (DMAc) $M_w$=37,300, $M_n$=14,550, PDI=2.6). FT-IR characterization of the polymer showed peaks at 1861 cm$^{-1}$ and 1778 cm$^{-1}$ for the presence of the carbonyl groups of the cyclic anhydride structure from MA and at 1700 cm$^{-1}$ for the carbonyl groups of the cyclic imide structure from N-CyHexMI. The composition of the polymer is estimated to be 50/23/27 of NBD/N-CyHexMI/MA based on $^{13}$C-NMR data.

Example 5

Tetrapolymer of NBD/N-CyHexMI/MI/MA

Maleic anhydride (MA, 20.6 g, 210 mmol), N-CyHexMI (18.8 g, 105 mmol), MI (3.4 g, 35 mmol) and 2,5-norbornadiene (NBD, 32.2 g, 350 mmol) were dissolved in cyclopentanone (143 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (2.1 g, 5.3 mmol) was then added and the mixture was allowed to stir at 65-70° C. for 5 hrs, after which the solution was cooled to room temperature. About 220 g of the polymer solution was mixed with THF (17 g). The polymer was precipitated from about 20 g of this polymer solution by adding into excess heptanes, filtered and dried in a vacuum oven at 80° C. for 20 hrs. Approximately 5.7 g (90% yield) of the NBD/N-CyHexMI/MI/MA polymer was isolated (GPC (DMAc) $M_w$=36,600, $M_n$=13,000, PDI=2.8). $^{13}$C-NMR characterization of the polymer in deuterated DMSO showed peaks at 10-20 ppm for the presence of cyclopropane structure and peaks at about 170-180 ppm for the presence of carbonyl groups of the cyclic anhydride structure from MA, N-CyHexMI and N-HMI. FT-IR characterization of the polymer showed peaks at 1861 cm$^{-1}$ and 1774 cm$^{-1}$ for the presence of the carbonyl groups of cyclic anhydride structure from MA, and 1696 cm$^{-1}$ for the carbonyl groups cyclic anhydride structure from N-CycHexMI and MI. The composition of the polymer is estimated to be 53% NBD and 47% of N-CyHexMI, MI and MA based on $^{13}$C-NMR data.

Example 6

Tetrapolymer of NBD/N-CyHexMI/MI/MA

Maleic anhydride (MA, 26.5 g, 270 mmol), N-CyHexMI (34 g, 190 mmol), MI (3.9 g, 40 mmol) and 2,5-norbornadiene (NBD, 46 g, 500 mmol) were dissolved in cyclopentanone (228 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (2 g, 5 mmol) added in two batches with a 5 mins interval and the mixture was allowed to stir at 65-70° C. for 5 hrs, after which the solution was cooled to room temperature. The polymer was precipitated from about 25 g of this polymer solution by adding into excess heptanes, filtered and dried in a vacuum oven at 80° C. for 20 hrs. Approximately 7.5 g (87% yield) of the NBD/N-CyHexMI/MI/MA polymer was isolated (GPC (DMAc) $M_w$=42,550, $M_n$=16,600, PDI=2.6). $^{13}$C-NMR characterization of the polymer in deuterated DMSO showed peaks at 10-20 ppm for the presence of cyclopropane structure and peaks at about 170-180 ppm for the presence of carbonyl groups of cyclic anhydride structure from MA, N-CyHexMI and N-HMI. FT-IR characterization of the polymer showed peaks at 1860 cm$^{-1}$ and 1777 cm$^{-1}$ for the presence of the carbonyl groups of cyclic anhydride structure from MA and at 1699 cm$^{-1}$ for the carbonyl groups cyclic imide structure from N-CyHexMI and N-HMI. The composition of the polymer is estimated to be 47% NBD, 32% MA and 20% N-CyHexMI and N-HMI based on $^{13}$C-NMR data.

Example 7

Tetrapolymer of NBD/N-PhMI/MI/MA

Maleic anhydride (MA, 13.7 g, 153 mmol), N-PhMI (20.9 g, 121 mmol), MI (6.8 g, 70 mmol) and 2,5-norbornadiene (NBD, 32.2 g, 350 mmol) were dissolved in cyclopentanone (113.5 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (2.1 g, 5.3 mmol) added and the mixture was allowed to stir at 65-70° C. for 5 hrs, after which the solution was cooled to room temperature. THF (125 g) and toluene (100 g) added to the reaction mixture. The polymer was precipitated from about 30 g of this solution by adding into excess heptanes, filtered and dried in a vacuum oven at 60° C. for 24 hrs. Approximately 4.1 g (83% yield) of the NBD/N-CyHexMI/MI/MA polymer was isolated (GPC (DMAc) $M_w$=68,700, $M_n$=19,600, PDI=3.5). $^{13}$C-NMR characterization of the polymer in deuterated DMSO showed peaks at 10-20 ppm for the presence of cyclopropane structure and peaks at about 175 ppm for the presence of carbonyl groups of cyclic anhydride structure from MA, N-CyHexMI and MI. FT-IR characterization of the polymer showed peaks at 1860 cm$^{-1}$ and 1778 cm$^{-1}$ for the presence of the carbonyl groups of cyclic anhydride structure from MA and at 1708 cm$^{-1}$ for the carbonyl groups cyclic imide structure from N-PhMI and N-HMI.

ROMA Polymers

The following examples illustrate the preparation of a variety of ROMA polymers of this invention. Various other ROMA polymers can be synthesized using similar procedures and various other COMA polymers and using appropriate alcohols as needed.

Example 8

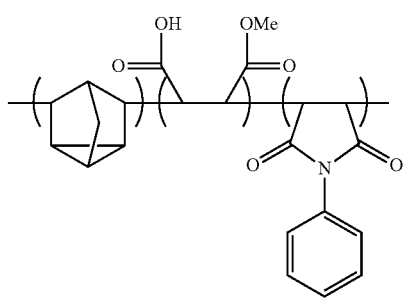

Terpolymer of NBD/N-PhMI/ROMA-MeOH

The polymer from Example 1 (NBD/N-PhMI/MA terpolymer, 12 g), THF (75 g), methanol (25 g) and 25% sodium methoxide in methanol (5.5 g) were mixed in an appropriately sized reaction vessel having a nitrogen inlet/outlet, water-cooling condenser and a port for a thermocouple. The mixture was heated to 60° C. for 6 hrs while stirring under nitrogen atmosphere. Concentrated hydrochloric acid (6 g) was added to the reaction mixture slowly and heating continued for 2 hrs. The solution was cooled to room temperature and toluene (30 g), THF (20 g) and distilled water (30 g) added while stirring. The stirring stopped and the solution was allowed to phase separate. The bottom aqueous layer was removed. Concentrated hydrochloric acid (6 g) was again added to the polymer solution and stirred for about 15 minutes. The polymer solution was washed five times using 50 g of distilled water at each step. About 20 g of THF added to the solution at each step to facilitate phase separation. The polymer was precipitated by adding the solution to excess heptanes (200 g), filtered, washed with heptanes (200 g) and dried in a vacuum oven at 60° C. for 20 hrs. Approximately 11 g (84% yield) of the NBD/N-PhMI/ROMA-MeOH polymer was isolated (GPC (DMAc) $M_w$=61,950, $M_n$=19,750, PDI=3.14). FT-IR characterization of the polymer showed no peaks at 1860 cm$^{-1}$ and 1781 cm$^{-1}$ for the presence of the carbonyl groups of cyclic anhydride structure from MA. A peak at 1713 cm$^{-1}$ indicated the presence of carbonyl groups of carboxylic acid, its ester and the carbonyl of maleimide of N-PhMI. A broad peak at 2400-3600 cm$^{-1}$ indicated the presence of hydroxyl group of a carboxylic acid.

Example 9

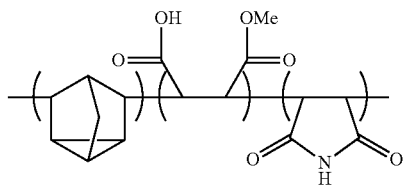

Terpolymer of NBD/MI/ROMA-MeOH

The polymer from Example 2 (NBD/N-HMI/MA, 15 g), cyclopentanone (45 g), THF (20 g), methanol (15 g) and 25% sodium methoxide in methanol (11.7 g) were mixed in an appropriately sized reaction vessel having a nitrogen inlet/outlet, water-cooling condenser and a port for a thermocouple. The mixture was heated to 60° C. for 6 hrs while stirring under nitrogen atmosphere. Concentrated hydrochloric acid (11 g) was added to the reaction mixture slowly and heating continued for 2 hrs. The solution was cooled to room temperature and distilled water (30 g) was added while stirring. The stirring stopped and the solution was allowed to phase separate. The bottom aqueous layer removed. Concentrated hydrochloric acid (11 g) added to the polymer solution and stirred for about 15 minutes. The polymer solution was washed five times using 50 g of distilled water at each step. About 20 g of THF added to the solution at each step to facilitate phase separation. The polymer was precipitated by adding the solution to excess heptanes (200 g), filtered, washed with heptanes (200 g) and dried in a vacuum oven at 60° C. for 20 hrs. Approximately 13.8 g (79% yield) of the NBD/MI/ROMA-MeOH polymer was isolated (GPC (DMAc) $M_w$=53,200, $M_n$=27,150, PDI=1.96). FT-IR characterization of the polymer showed no peaks at 1859 cm$^{-1}$ and 1775 cm$^{-1}$ for the presence of the carbonyl groups of cyclic anhydride structure from MA. A peak at 1719 cm$^{-1}$ indicated the presence of carbonyl groups of carboxylic acid, its ester and carbonyl groups of MI. A broad peak at 2300-3600 cm$^{-1}$ indicated the presence of hydroxyl group of a carboxylic acid. The composition of the polymer is estimated to be 49/11/40 NBD/MI/ROMA-MeOH based on $^1$H-NMR and $^{13}$C-NMR data. The NMR data further showed that the composition of NBD repeat units were as follows: repeat units of formula (IA)—46 mol %; repeat units of formula (IB)—3 mol %.

Example 10

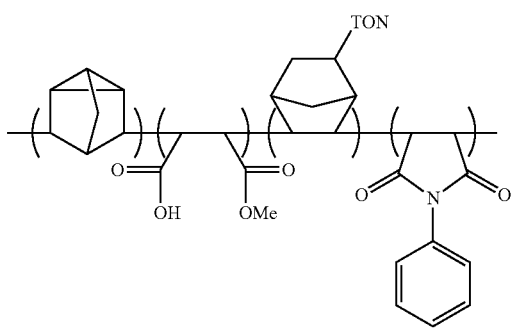

where TON=CH$_2$OCH$_2$CH$_2$OCH$_2$CH$_2$OCH$_3$

Tetrapolymer of
NBD/NBTON/N-PhMI/ROMA-MeOH

The polymer solution from Example 3 (NBD/NBTON/N-PhMI/MA, 175 g) and 25% sodium methoxide in methanol (20 g) were mixed in an appropriately sized reaction vessel having a nitrogen inlet/outlet, water-cooling condenser and a port for a thermocouple. The mixture was heated to 60° C. for 6 hrs while stirring under nitrogen atmosphere. Concentrated hydrochloric acid (20 g) was added to the reaction mixture slowly and heating continued for 2 hrs. The solution was cooled to room temperature and distilled water (100 g) was added while stirring. The stirring was stopped and the solution was allowed to phase separate. The bottom aqueous layer was removed. The polymer solution was washed five times using 100 g of distilled water at each step. About 50 g of THF added to the solution at each step to facilitate phase separation. The polymer was precipitated by adding the solution to excess heptanes (2 L), filtered, washed with heptanes (1 L) and dried in a vacuum oven at 60° C. for 20 hrs. Approximately 23.5 g (51% yield) of the NBD/NBTON/N-PhMI/ROMA-MeOH polymer was isolated (GPC (DMAc) $M_w$=18,950, $M_n$=12.150 PDI=1.56). FT-IR characterization of the polymer showed no peaks at 1859 cm$^{-1}$ and 1779 cm$^{-1}$ for the presence of the carbonyl groups of cyclic anhydride structure from MA. A peak at 1713 cm$^{-1}$ indicated the presence of carbonyl groups of carboxylic acid, its ester and N-PhMI. A broad peak at 2300-3600 cm$^{-1}$ indicated the presence of hydroxyl group of a carboxylic acid.

Example 11

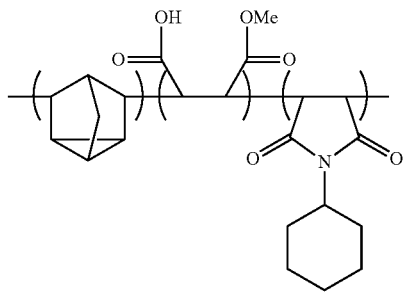

Terpolymer of NBD/N-CyHexMI/ROMA-MeOH

The polymer solution from example 4 (NBD/N-CyHexMI/MA, 320 g) and toluene (125 g) was transferred to an appropriately sized reaction vessel having a nitrogen inlet/outlet, water-cooling condenser and a port for a thermocouple, and methanol (50 g) and 25% sodium methoxide in methanol (50 g) were mixed and transferred to the reaction vessel. The mixture was heated to 60° C. for 6 hrs while stirring under nitrogen atmosphere. Concentrated hydrochloric acid (50 g) was added to the reaction mixture slowly and heating continued for 2 hrs. The solution was cooled to room temperature and distilled water (250 g) was added while stirring. The stirring stopped and the solution was allowed to phase separate. The bottom aqueous layer was removed. The polymer solution was washed five times using 250 g of distilled water at each step. About 50 g of THF added to the solution at each step to facilitate phase separation. The polymer was precipitated by adding the solution to excess heptanes (2 L), filtered, washed with heptanes (1 L) and dried in a vacuum oven at 60° C. for 20 hrs. Approximately 80 g (77% yield) of the NBD/N-CyHexMI/ROMA-MeOH polymer was isolated (GPC (DMAc) $M_w$=42,750, $M_n$=16,400, PDI=2.6). FT-IR characterization of the polymer showed no peaks at 1861 cm$^{-1}$ and 1778 cm$^{-1}$ for the presence of the carbonyl groups of cyclic anhydride structure from MA. A peak at 1736 cm$^{-1}$ indicated the presence of carbonyl groups of carboxylic acid, its ester and a peak at 1700 cm$^{-1}$ indicated the presence of carbonyl peaks of N-CyHexMI. A broad peak at 2500-3600 cm$^{-1}$ indicated the presence of hydroxyl group of a carboxylic acid.

Example 12

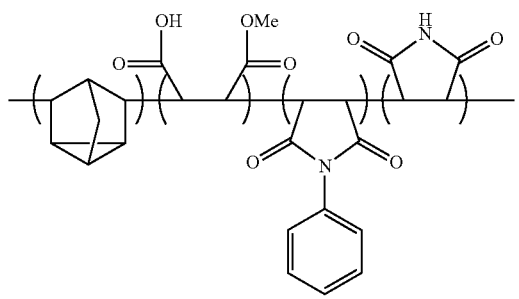

Tetrapolymer of
NBD/N-CyHexMI/MI/ROMA-MeOH

The polymer solution from Example 5 (NBD/N-CyHexMI/MI/MA 220 g), THF (150 g), methanol (50 g) and 25% sodium methoxide in methanol (40 g) were mixed in an appropriately sized reaction vessel having a nitrogen inlet/outlet, water-cooling condenser and a port for a thermocouple. The mixture was heated to 60° C. for 6 hrs while stirring under nitrogen atmosphere. Concentrated hydrochloric acid (42 g) was added to the reaction mixture slowly and heating continued for 2 hrs. The solution was cooled to room temperature. Toluene (100 g) and distilled water (250 g) were then added while stirring. The stirring stopped and the solution was allowed to phase separate. The bottom aqueous layer was removed. The polymer solution was washed five times using 250 g of distilled water at each step. About 40 g of THF added to the solution at each step to facilitate phase separation. The polymer was precipitated by adding the solution to excess heptanes (1 L), filtered, washed with heptanes and dried in a vacuum oven at 60° C. for 20 hrs. Approximately 56 g (74% yield) of the NBD/N-CyHexMI/MI/ROMA-MeOH polymer was isolated (GPC (DMAc) $M_w$=44,200, $M_n$=16,350, PDI=2.7). FT-IR characterization of the polymer showed no peaks at 1861 $cm^{-1}$ and 1774 $cm^{-1}$ for the presence of the carbonyl groups of cyclic anhydride structure from MA. Peak at 1699 $cm^{-1}$ indicated the presence of carbonyl groups of carboxylic acid, its ester, MI and N-CyHexMI. A broad peak at 2300-3600 $cm^{-1}$ indicated the presence of hydroxyl group of a carboxylic acid.

Example 13

Tetrapolymer of
NBD/N-CyHexMI/MI/ROMA-MeOH

The polymer solution from Example 6 (NBD/N-CyHexMI/N-HMI/MA, 200 g) was transferred to an appropriately sized reaction vessel having a nitrogen inlet/outlet, water-cooling condenser and a port for a thermocouple and toluene (75 g) was added. Methanol (37 g) and 25% sodium methoxide in methanol (37 g) were mixed and added to the reaction vessel. The mixture was heated to 60° C. for 6 hrs while stirring under nitrogen atmosphere and allowed to cool to the ambient temperature. Concentrated hydrochloric acid (40 g) was added to the reaction mixture slowly and heating continued for 2 hrs. The solution was cooled to room temperature and distilled water (200 g) was added while stirring. The stirring was stopped and the solution was allowed to phase separate. The bottom aqueous layer removed. The polymer solution was washed five times using 200 g of distilled water at each step. About 50 g of THF added to the solution at each step to facilitate phase separation. The polymer was precipitated by adding the solution to excess heptanes (1 L), filtered, washed with heptanes and dried in a vacuum oven at 60° C. for 20 hrs. Approximately 49.6 g (71% yield) of the NBD/N-CyHexMI/MI/ROMA-MeOH polymer was isolated (GPC (DMAc) $M_w$=48,256, $M_n$=18,993, PDI=2.54). FT-IR characterization of the polymer showed no peaks at 1861 $cm^{-1}$ and 1774 $cm^{-1}$ for the presence of the carbonyl groups of cyclic anhydride structure from MA. Peaks at 1735 $cm^{-1}$ and 1697 $cm^{-1}$ indicated the presence of carbonyl groups of carboxylic acid, its ester, MI, and N-CyHexMI. A broad peak at 2300-3600 $cm^{-1}$ indicated the presence of hydroxyl group of a carboxylic acid.

Example 14

Tetrapolymer of NBD/N-PhMI/MI/ROMA-MeOH

The polymer solution from Example 7 (NBD/N-PhMI/MI/MA, 415 g) was transferred to an appropriately sized reaction vessel having a nitrogen inlet/outlet, water-cooling condenser and a port for a thermocouple. Methanol (30 g) and 25% sodium methoxide in methanol (30 g) were mixed and added to the reaction vessel. The mixture was heated to 60° C. for 6 hrs while stirring under nitrogen atmosphere and allowed to cool to the ambient temperature. Concentrated hydrochloric acid (36 g) was added to the reaction mixture slowly and heating continued for 2 hrs. The solution was cooled to room temperature and distilled water (200 g) was added while stirring. The stirring stopped and the solution was allowed to phase separate. The bottom aqueous layer was removed. The polymer solution was washed five times using 200 g of distilled water at each step. About 50 g of THF added to the solution at each step to facilitate phase separation. The polymer was precipitated by adding the solution to excess heptanes (2.5 L), filtered, washed with heptanes and dried in a vacuum oven at 60° C. for 24 hrs. Approximately 57.5 g (80% yield) of the NBD/N-PhMI/MI/ROMA-MeOH polymer was isolated (GPC (DMAc) $M_w$=73,200, $M_n$=20,850, PDI=3.5). FT-IR characterization of the polymer showed no peaks at 1861 $cm^{-1}$ and 1774 $cm^{-1}$ for the presence of the carbonyl groups of cyclic anhydride structure from MA. Peaks at 1710 $cm^{-1}$ indicated the presence of carbonyl groups of carboxylic acid, its ester, MI, and N-PhMI. A broad peak at 2300-3600 $cm^{-1}$ indicated the presence of hydroxyl group of a carboxylic acid.

The following polymers were prepared to form comparative compositions in order to show superior properties of the polymers of their invention and the compositions derived therefrom.

Comparative Example 1

Copolymer of NB/MA

Maleic anhydride (14.7 g, 150 mmol) and norbornene (14.1 g, 150 mmol) were dissolved in toluene (70 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (1.2 g, 3 mmol) was added and the mixture was allowed to stir at 65-70° C. for 5 hrs, after which the solution was cooled to room temperature. The solid polymer was separated out of the solution and washed with excess heptanes, filtered and dried in a vacuum oven at 80° C. for 20 hrs. Approximately 16.4 g (57% yield) of the NB/MA polymer was isolated (GPC (DMAc) $M_w$=21,350, $M_n$=13,550, PDI=1.6). $^{13}$C-NMR characterization of the polymer in deuterated DMSO showed no peaks at 10-20 ppm for the presence of cyclopropane structures. A peak at about 175 ppm for the presence of the carbonyl groups of cyclic anhydride structure from MA was observed. FT-IR characterization of the polymer showed peaks at 1853 cm$^{-1}$ and 1778 cm$^{-1}$ for the presence of the carbonyl groups of cyclic anhydride structure from MA. The composition of the polymer is estimated to be 43/57 of NB/MA based on $^{13}$C-NMR data.

Comparative Example 2

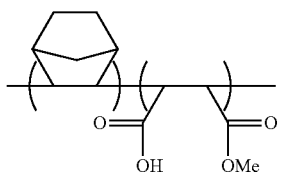

Copolymer of NB/ROMA-MeOH

The polymer from Comparative Example 1 (NBD/MA, 12 g), THF (20 g), toluene (30 g), methanol (15 g) and 25% sodium methoxide in methanol (13.1 g) were mixed in an appropriately sized reaction vessel having a nitrogen inlet/outlet, water-cooling condenser and a port for a thermocouple. The mixture was heated to 60° C. for 6 hrs while stirring under nitrogen atmosphere. Concentrated hydrochloric acid (13 g) was added to the reaction mixture slowly and heating continued for 2 hrs. The solution was cooled to room temperature. THF (20 g) and distilled water (30 g) were added while stirring. The stirring stopped and the solution was allowed to phase separate. The bottom aqueous layer removed. Concentrated hydrochloric acid (13 g) added to the polymer solution and stirred for about 15 minutes. The polymer solution was washed five times using 50 g of distilled water at each step. About 20 g of THF added to the solution at each step to facilitate phase separation. The polymer was precipitated by adding the solution to excess heptanes (200 g), filtered, washed with heptanes (200 g) and dried in a vacuum oven at 60° C. for 20 hrs. Approximately 10.9 g (75% yield) of the NB/ROMA-MeOH polymer was isolated (GPC (DMAc) $M_w$=25,100, $M_n$=16,800, PDI=1.5). FT-IR characterization of the polymer showed only minor peaks at 1853 cm$^{-1}$ and 1778 cm$^{-1}$ for the presence of the carbonyl groups of cyclic anhydride structure from MA. A peak at 1727 cm$^{-1}$ indicated the presence of carbonyl groups of carboxylic acid and its ester. A broad peak at 2300-3600 cm$^{-1}$ indicated the presence of hydroxyl group of a carboxylic acid.

Comparative Example 3

Copolymer of NBD/MA

Maleic anhydride (12.25 g, 125 mmol) and 2,5-norbornadiene (11.5 g, 125 mmol) were dissolved in toluene (74.2 g) and charged to an appropriately sized reaction vessel having a nitrogen inlet/outlet, water-cooling condenser and a port for a thermocouple. The solution was sparged with nitrogen for 10 min to remove oxygen and then heated to about 65° C. Lauryl peroxide (1 g, 2.5 mmol) was added and the mixture was allowed to stir at 65-70° C. for 5.0 hrs, after which the solution was cooled to room temperature. The solid polymer was separated out of the solution and washed with excess heptanes, filtered and dried in a vacuum oven at 80° C. for 20 hrs. Approximately 19 g (80% yield) of the NBD/MA polymer was isolated (GPC (DMAc) $M_w$=75,000, $M_n$=21,600, PDI=3.5). $^{13}$C-NMR characterization of the polymer in deuterated DMSO showed peaks at 10-20 ppm for the presence of cyclopropane structures and at about 175 ppm for the presence of the carbonyl groups of cyclic anhydride structure from MA. FT-IR characterization of the polymer showed peaks at 1860 cm$^{-1}$ and 1782 cm$^{-1}$ for the presence of the carbonyl groups of cyclic anhydride structure from MA. The composition of the polymer is estimated to be 51/49 of NBD/MA based on $^{13}$C-NMR data. The NMR data further showed that the composition of NBD repeat units were as follows: repeat units of formula (IA)—47 mol %; repeat units of formula (IB)—4 mol %.

Comparative Example 4

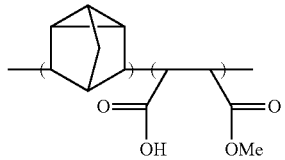 [SMILES: COC(=O)C(C)C(C(=O)O)C1C2CC3C(C2C)C31]

Copolymer of NBD/ROMA-MeOH

The polymer from Comparative Example 3 (NBD/MA, 12 g), THF (75 g), methanol (25 g) and 25% sodium methoxide in methanol (13.4 g) were mixed in an appropriately sized reaction vessel having a nitrogen inlet/outlet, water-cooling condenser and a port for a thermocouple. The mixture was heated to 60° C. for 6 hrs while stirring under nitrogen atmosphere. Concentrated hydrochloric acid (13 g) was added to the reaction mixture slowly and heating continued for 2 hrs. The solution was cooled to room temperature and toluene (30 g), THF (20 g) and distilled water (30 g) were added while stirring. The stirring stopped and the solution was allowed to phase separate. The bottom aqueous layer removed. Concentrated hydrochloric acid (13 g) was again added to the polymer solution and stirred for about 15 minutes. The polymer solution was washed five times using 50 g of distilled water at each step. About 20 g of THF added to the solution at each step to facilitate phase separation. The polymer was precipitated by adding the solution to excess heptanes (200 g), filtered, washed with heptanes (200 g) and dried in a vacuum oven at 60° C. for 20 hrs. Approximately 11 g (75% yield) of the NBD/ROMA-MeOH polymer was isolated (GPC (DMAc) $M_w$=96,500, $M_n$=29,250, PDI=3.3). FT-IR characterization of the polymer showed no peaks at 1860 cm$^{-1}$ and 1782 cm$^{-1}$ for the presence of the carbonyl groups of cyclic anhydride structure from MA. A peak at 1735 cm$^{-1}$ indicated the presence of carbonyl groups of carboxylic acid and its ester. A broad peak at 2300-3600 cm$^{-1}$ indicated the presence of hydroxyl group of a carboxylic acid.

Photoimagable Compositions

The following examples illustrate formation of the various compositions of this invention containing a polymer, PAC and a variety of other components/additives as described herein.

Example 15

A fully ring opened NBD/N-PhMI/ROMA-MeOH terpolymer of Example 8 (100 parts) was dissolved in GBL (500 parts) having the specific amounts of additives, expressed as parts per hundred resin (phr): TrisP3M6C-2-201 (25 phr) as a photo-active compound, TMPTGE (40 phr) as an epoxide crosslinker, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 16

A fully ring opened NBD/MI/ROMA-MeOH terpolymer of Example 9 (100 parts) was dissolved in NMP (200 parts) having the specific amounts of additives, expressed as parts per hundred resin (phr): TrisP3M6C-2-201 (25 phr) as a photo-active compound, TMPTGE (40 phr) as an epoxide crosslinker, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 17

A fully ring opened NBD/N-CyHexMI/MI/ROMA-MeOH tetrapolymer of Example 12 (100 parts) was dissolved in GBL (200 parts) and NMP (30 parts) having the specific amounts of additives, expressed as parts per hundred resin (phr): TrisP3M6C-2-201 (25 phr) as a photo-active compound, VG3101L (30 phr) and GE-36 (25 phr) as epoxide crosslinkers, KBM-403E (5 phr) as an adhesion promoter, CXC 1761 (0.3 phr) as a thermal base catalyst and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 18

A fully ring opened NBD/N-CyHexMI/MI/ROMA-MeOH tetrapolymer of Example 13 (100 parts) was dissolved in GBL (200 parts) and NMP (30 parts) having the specific amounts of additives, expressed as parts per hundred resin (phr): TrisP3M6C-2-201 (27.5 phr) as a photoactive compound, VG3101L (30 phr) and GE-36 (30 phr) as epoxide crosslinkers, KBM-403E (5 phr) as an adhesion promoter, CXC 1761 (0.3 phr) as a thermal base catalyst and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 m pore polytetrafluoroethylene (PTFE) disc filter, the filtered polymer solution was collected in a low particle HDPE amber bottle and the resulting solution stored at 5° C.

Example 19

A fully ring opened NBD/N-CyHexMI/MI/ROMA-MeOH tetrapolymer of Example 13 (100 parts) was dissolved in GBL (200 parts) and NMP (30 parts) having the specific amounts of additives, expressed as parts per hundred resin (phr): TrisP3M6C-2-201 (27.5 phr) as a photoactive compound, VG3101L (30 phr), GT-401 (10 phr) and GE-36 (30 phr) as epoxide crosslinkers, KBM-403E (5 phr) as an adhesion promoter, CXC 1761 (0.3 phr) as a thermal base catalyst and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 20

A fully ring opened NBD/N-CyHexMI/MI/ROMA tetrapolymer of Example 13 (100 parts) was dissolved in GBL (200 parts) and NMP (30 parts) having the specific amounts of additives, expressed as parts per hundred resin (phr): TrisP3M6C-2-201 (27.5 phr) as a photo-active compound, VG3101L (30 phr), GE-36 (30 phr), JER1032H60 (10 phr) and GT-401 (10 phr) as epoxide crosslinkers, KBM-403E (5 phr) as an adhesion promoter, CXC 1761 (0.3 phr) as a thermal base catalyst and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 21

A fully ring opened NBD/N-PhMI/ROMA terpolymer of Example 8 (100 parts) was dissolved in GBL (250 parts) having the specific amounts of additives, expressed as parts per hundred parts resin (phr): TrisP3M6C-2-201 (25 phr) as a photo-active compound, Powderlink 1174 (40 phr) and Heloxy 505 (20 phr) as epoxide crosslinkers, KBM-403E (5 phr) as an adhesion promoter, CXC 1761 (0.3 phr) as a thermal base catalyst and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 22

A fully ring opened NBD/N-PhMI/ROMA terpolymer of Example 14 (100 parts) was dissolved in GBL (250 parts) having the specific amounts of additives, expressed as parts per hundred parts resin (phr): TrisP3M6C-2-201 (25 phr) as a photo-active compound, VG3101L (40 phr) as an epoxide cross linker, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Comparative Example 5

A fully ring opened NB/ROMA-MeOH copolymer of Comparative Example 2 (100 parts) was dissolved in GBL (200 parts) having the specific amounts of additives, expressed as parts per hundred resin (phr): TrisP3M6C-2-201 (25 phr) as a photo-active compound, TMPTGE (40 phr) as an epoxide cross linker, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Comparative Example 6

A fully ring opened NBD/ROMA-MeOH copolymer of Comparative Example 4 (100 parts) was dissolved in GBL (500 parts) having the specific amounts of additives, expressed as parts per hundred resin (phr): TrisP3M6C-2-201 (25 phr) as a photo-active compound, TMPTGE (40 phr) as an epoxide crosslinker, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter, the filtered polymer solution was collected in a low particle HDPE amber bottle and the resulting solution stored at 5° C.

Example 23

FT-IR Measurements

The composition as obtained in Comparative Example 6 was spin coated on a 5-inch bare silicon wafer at a spin speed of 600 rpm for 30 seconds. The coated film was post apply baked (PAB) at 120° C. on a hot plate for 3 minutes to obtain a film thickness of 15.1 μm. This film was hard baked at 200° C. for 1 hr in an oven kept under nitrogen atmosphere. The film thickness dropped to 14.2 μm after the hard bake. The cured film on the bare silicon wafer was diced into about 10 mm wide strips. The 10 mm wide film strips were lifted out of the wafer by immersing in 1 wt. % hydrogen fluoride solution and allowed to dry in air. The FT-IR of a sample of the film was recorded and shown in top of FIG. 1, designated as "Comparative Example 6".

Likewise the composition as obtained in Comparative Example 5 was spin coated on a 5-inch bare silicon wafer at a spin speed of 300 rpm for 30 seconds. The coated film was post apply baked (PAB) at 120° C. on a hot plate for 3 minutes to obtain a film thickness of 21.3 μm. This film was hard baked at 200° C. for 1 hr in an oven kept under nitrogen atmosphere. The film thickness dropped to 19.7 μm after the hard bake. The cured film on the bare silicon wafer was diced into about 10 mm wide strips. The 10 mm wide film strips were lifted out of the wafer by immersing in 1 wt. % hydrogen fluoride solution and allowed to dry in air. The FT-IR of a sample of the film was recorded and also shown in bottom of FIG. 1, designated as "Comparative Example 5." Both of these IP spectra as shown in FIG. 1 show peaks at about 1860 cm$^{-1}$ and 1780 cm$^{-1}$ for the presence of cyclic anhydride and a peak at 1732 cm$^{-1}$ for the presence of carboxylic acid and a carboxylic acid ester. The carboxylic acid ester peak is representative of the methyl ester of the carboxylic acid of ROMA polymer examples and the ester formed by the reaction of carboxylic acid of NBD/ROMA or NB/ROMA with the epoxide cross linker, TMPTGE.

It is shown in top IR spectrum in FIG. 1 that the height of the peak at about 1780 cm$^{-1}$ of the cured film of Comparative Example 6 containing NBD/ROMA is only about half of the height of the peak at 1732 cm$^{-1}$ suggesting lower degree of ring closing compared to cross linking with TMPTGE. It is also shown in bottom IR spectrum in FIG. 1 that the height of the peak at about 1780 cm$^{-1}$ of the cured film of the composition from the Comparative Example 5 containing NB/ROMA is higher than the height of the peak at 1732 cm$^{-1}$ suggesting higher degree of ring closing compared to cross linking with TMPTGE.

This Example clearly demonstrates that the compositions containing the NBD polymers do not form as much ring-closed structures (i.e., repeat units of formula (IIB)) and therefore are more highly crosslinked, thus featuring improved thermomechanical properties as further manifested by the following Examples.

Example 24

Glass Transition ($T_g$) and Coefficient of Thermal Expansion (CTE) Measurements The compositions from Examples 15, 16 and Comparative Examples 5 and 6 were spin coated on 5-inch bare silicon wafers and post apply baked (PAB) at 120° C. on a hot plate for 3 minutes. These films were hard baked at 200° C. for 1 hr in an oven kept under nitrogen atmosphere. The cured films on the bare silicon wafer were diced into about 10 mm wide strips. The 10 mm wide film strips were lifted out of the wafer by immersing in 1 wt. % hydrogen fluoride solution and allowed to dry in air. The glass transition temperatures and coefficients of thermal expansion (CTE) were measured by thermomechanical analysis (TMA) instrument at 10° C./min temperature ramp and 0.02N force. Glass transition temperatures ($T_g$) were also measured by dynamic mechanical analysis instrument (DMA). The CTE measured at about 60-120° C. range and glass transition temperatures as $T_\alpha$ and $T_\beta$ are summarized in Table 1. In some instances only one glass transition were observed. It is clear from the data presented in Table 1 that the polymers (i.e., NBD/maleimide/ROMA polymers) of this invention generally exhibit higher glass transition temperatures than the polymers of the comparative examples (i.e., both NB/ROMA polymer and NBD/ROMA polymer).

Figure 2:
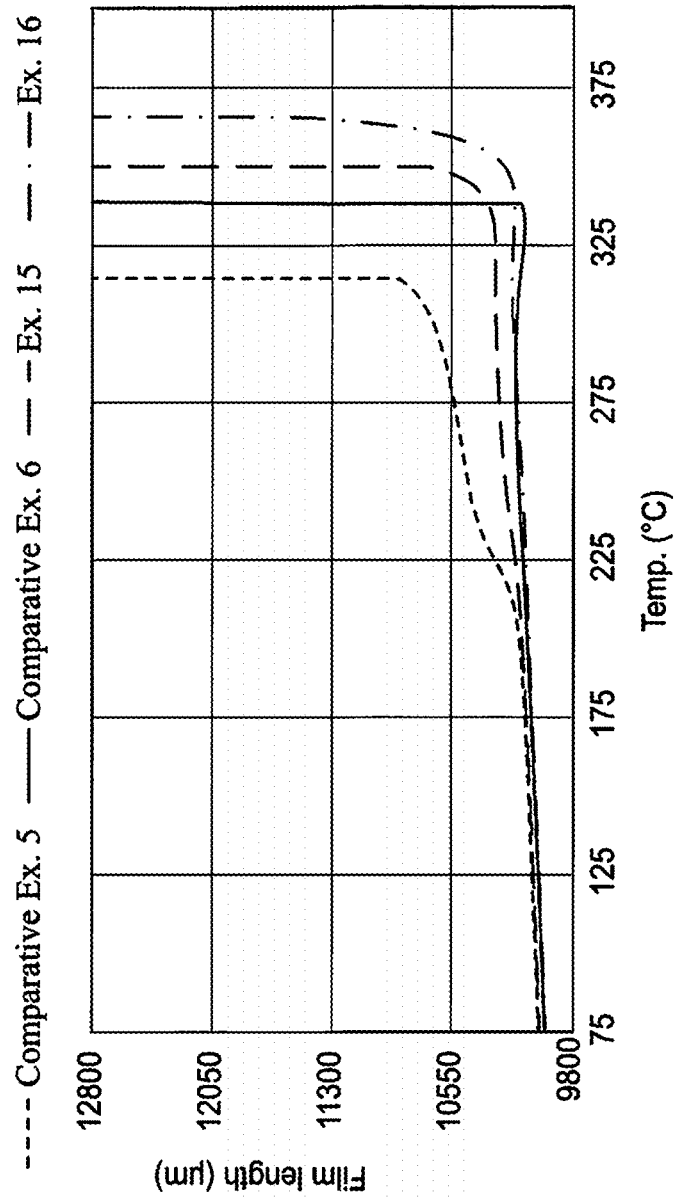
FIG. 2 shows thermal properties of two specific composition embodiments of this invention which are compared with two comparative compositions as described herein.

FIG. 2 shows the thermograms of each of these samples. It is clear from this data that the composition of Comparative Example 5 shows lower glass transition than all other samples. All of NBD containing compositions exhibit higher $T_g$ as also shown in FIG. 2, and the data as summarized in Table 1.

TABLE 1

| Example | CTE (ppm K$^{-1}$) | $T_\alpha$ (° C.) TMA | $T_\beta$ (° C.) TMA | $T_g$ (° C.) DMA |
|---|---|---|---|---|
| 15 | 67 | 343 | 210 | 351 |
| 16 | 72 | 370 | — | 353 |
| Comparative 5 | 79 | 314 | 220 | 270 |
| Comparative 6 | 80 | >350 | — | 341 |

Example 25

Thermomechanical Properties

The compositions from each of Examples 18 to 21 were spin coated on 5-inch bare silicon wafers and post apply baked (PAB) at 110-120° C. on a hot plate for 3 minutes. These films were hard baked at 200° C. for 2 hrs in an oven kept under nitrogen atmosphere. The cured films on the bare silicon wafer were diced into about 4.5 mm, 6.5 mm, 10 mm and 15 mm wide strips. The film strips were lifted out of the wafer by immersing in 1 wt. % hydrogen fluoride solution and allowed to dry in air. These rectangular films were cut into 20 mm length and thermomechanical properties were measured by Instron and TMA.

Likewise the compositions from each of Examples 18 to 21 were spin coated on 5-inch bare silicon wafers and post apply baked (PAB) at 105° C. on a hot plate for 3 minutes. The films were then exposed using a patterned mask to a broad band Hg-vapor light source (at 365 nm using a band pass filter) at an exposure dose of 750-1000 mJ/cm². The development of these exposed films by 2.4 wt. % TMAH retained rectangles of 4.5 mm, 6.5 mm and 15 mm film strips. These films were hard baked at 200° C. for 2 hrs in an oven kept under nitrogen atmosphere. The film strips were lifted out of the wafer by immersing in 1 wt. % hydrogen fluoride solution and allowed to dry in air. These rectangular films were cut into 20 mm length and mechanical properties were measured by Instron, thermomechanical analysis (TMA), after a stress relief bake of 10° C. to 250° C. at 5° C./min temperature ramp followed by cooling to 10° C., and dynamic mechanical analysis (DMA). The average mechanical properties of each of these Examples are summarized in Table 2.

TABLE 2

| Composition | Tensile Modulus (GPa) | Tensile Strength (MPa) | ETB (%) | CTE (ppmK$^{-1}$) | $T_\alpha$ (° C.) (TMA) | $T_g$ (° C.) (DMA) |
|---|---|---|---|---|---|---|
| 18 | 2.0 ± 0.3 | 68 ± 13 | 18 ± 13 | 108 | 300 | 278 |
| 19 | 1.8 ± 0.3 | 67 ± 16 | 22 ± 16 | 108 | >300 | 284 |
| 20 | 1.9 ± 0.1 | 72 ± 9 | 21 ± 17 | 111 | 340 | 274 |
| 21 | 3.4 ± 5 | 92 ± 10 | 4 ± 1 | −34 | >350 | — |

Example 26

Figure 3:
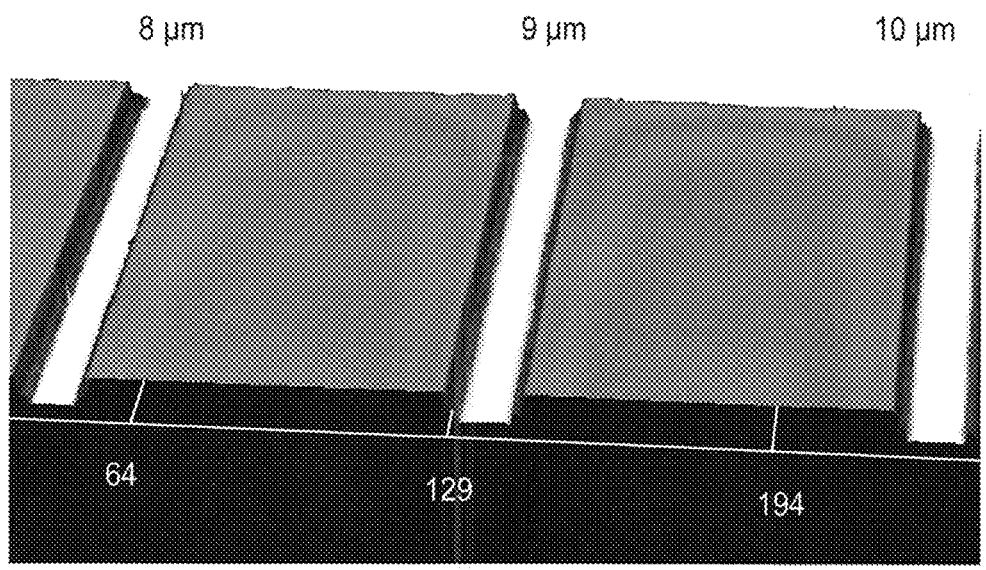
FIG. 3 shows two dimensional top down image generated by a laser microscope of a positive tone lithographic image of 8, 9 and 10 μm isolated trenches at an exposure dose of 327 mJ/cm$^2$ of one of the photosensitive composition embodiments of this invention.
Figure 4:
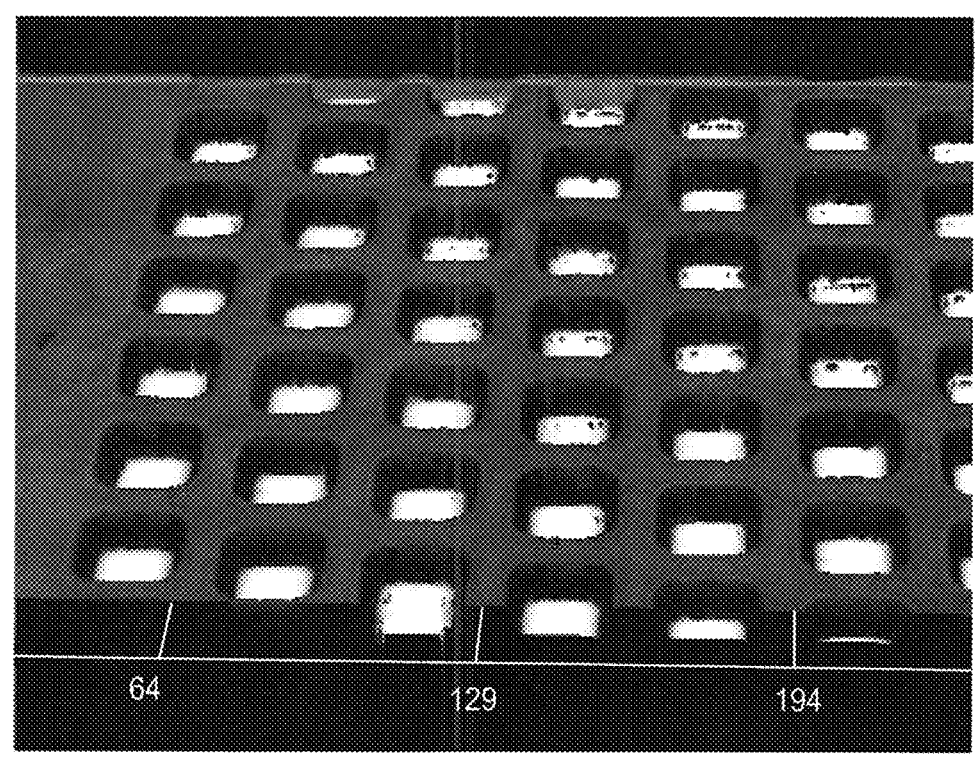
FIG. 4 shows three dimensional image generated by a laser microscope of a positive tone lithographic image of 15 μm square shaped via array obtained using one of the photosensitive composition embodiments of this invention.

The composition of Example 17 was spin coated at a spin speed of 1300 rpm for 30 seconds on a 4-inch thermal oxide silicon wafer. The coated film was post apply baked (PAB) at 100° C. on a hot plate for 3 minutes to obtain a film thickness of 8.52 m. The film was then exposed using a combination of a patterned mask and a variable density mask to a broad band Hg-vapor light source (at 365 nm using a band pass filter). The film was developed for 10 seconds with 2.4 wt. % TMAH in a puddle, rinsed with distilled water and dried using a stream of nitrogen. The film thicknesses (FT) after development was 6.14 µm. The unexposed film thickness loss or dark field loss (DFL) of 28% was calculated based on film thicknesses before and after development. The film was cured at 200° C. for 2 hours in an oven under nitrogen atmosphere. FIG. 3 shows the laser microscope generated 2-D photograph of a top down images of 8, 9, and 10 m trenches after the cure step at the exposure dose of 327 mJ/cm². FIG. 4 shows the laser microscope generated 3-D photograph of 15 µm square shaped via array at the exposure dose of 327 mJ/cm². Similar high resolution photographs were also obtained for 2, 3, and 4 µm trenches at the exposure dose of 327 mJ/cm², demonstrating that the compositions are suitable for such fine line lithographic resolutions.

Example 27

The composition of Example 17 was spin coated at a spin speed of 900 rpm for 30 seconds on 5-inch bare silicon wafers and post apply baked (PAB) at 105-110° C. on a hot plate for 3 minutes. The films were then exposed using a patterned mask to a broad band Hg-vapor light source (at 365 nm using a band pass filter) at an exposure dose of 1000 mJ/cm². The development of these exposed films by 2.4 wt. % TMAH retained rectangles of 4.5 mm, 6.5 mm and 15 mm film strips on the wafers. These films were hard baked at 200° C. for 2 hrs in an oven kept under nitrogen atmosphere. The film strips were lifted out of the wafer by immersing in 1 wt. % hydrogen fluoride solution and allowed to dry in air. These rectangular films were cut into 20 mm length and mechanical properties were measured by Instron, thermomechanical analysis (TMA) after a stress relief bake of 10° C. to 250° C. at 5° C./min temperature ramp followed by cooling to 10° C., dynamic mechanical analysis (DMA) without a stress relief bake and thermogravimetric analysis (TGA) in nitrogen atmosphere. The results are summarized in Table 3.

TABLE 3

| Tensile Modulus (GPa) | Tensile Strength (MPa) | ETB (%) | CTE (ppmK$^{-1}$) | $T_\alpha$ (° C.) (TMA) | $T_g$ (° C.) (DMA) | $T_{d5}$ (° C.) (TGA) |
|---|---|---|---|---|---|---|
| 2.3 ± 0.6 | 85 ± 22 | 17 ± 11 | 57 | 315 | 318 | 338 |

Example 28

This Example 28 demonstrates that excellent photoimagable patterns can be obtained from the compositions of this invention with almost no dark field loss (DFL) of the film.

Figure 5:
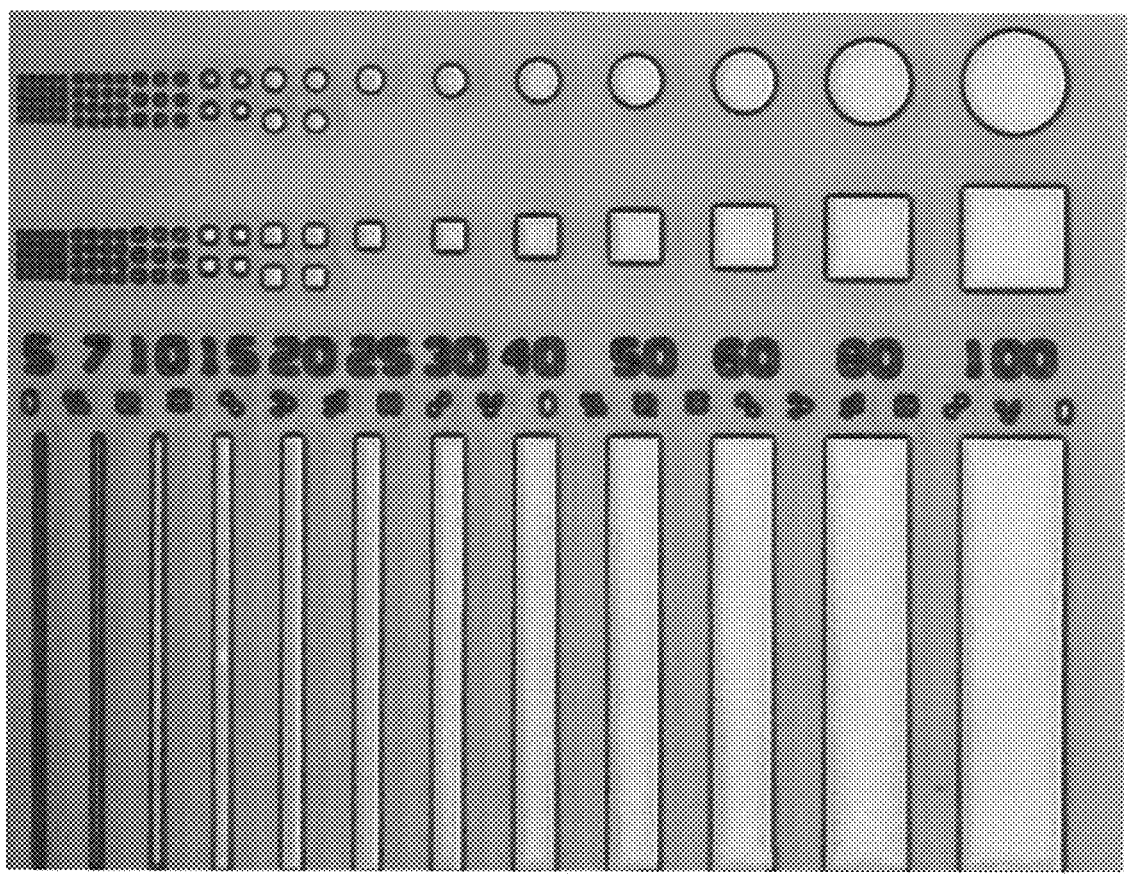
FIG. 5 shows optical micrograph of a positive tone lithographic images of line and space pattern obtained from a photosensitive composition embodiment of this invention.

The composition of Example 22 was spin coated at a spin speed of 700 rpm for 30 seconds on a 4-inch thermal oxide silicon wafer. The coated film was post apply baked (PAB)

at 110° C. on a hot plate for 3 minutes to obtain a film thickness of 10.8 µm. The film was then exposed using a combination of a patterned mask and a variable density mask to a broad band Hg-vapor light source (at 365 nm using a band pass filter). The film was developed for 158 seconds with 2.4 wt. % TMAH in a puddle, rinsed with distilled water and dried using a stream of nitrogen. A positive tone image was formed and observed under an optical microscope. Both trenches and contact holes were formed in 15 µm resolution. The film thicknesses (FT) in the unexposed area after development was 10.9 µm. The unexposed film thickness loss or dark field loss (DFL) of 0% was calculated based on film thicknesses before and after development. The film was cured at 200° C. for 2 hours in an oven under nitrogen atmosphere. FIG. 5 shows the optical microscope generated 2-D photograph of a top down images of trenches and contact holes at 5-100 µm after the cure step at the exposure dose of 791 mJ/cm$^2$. The trenches and contact holes are formed at 15 µm resolution.

Comparative Example 7

This Comparative Example 7 demonstrates that it is difficult to obtain photoimagable compositions from ROMA polymers derived from NBD and MA in which MA is ring opened with methanol alone under similar conditions as used to obtain photoimagable compositions of the invention as described specifically in Example 27.

The composition of Comparative Example 6 was spin coated at a spin speed of 600 rpm for 30 seconds on a 4-inch thermal oxide silicon wafer. The coated film was post apply baked (PAB) at 110° C. on a hot plate for 3 minutes to obtain a film thickness of 11 µm. The film was then exposed using a combination of a patterned mask and a variable density mask to a broad band Hg-vapor light source (at 365 nm using a band pass filter). The film was developed for 6 seconds with 2.4 wt. % TMAH in a puddle, rinsed with distilled water and dried using a stream of nitrogen. The film was completely removed by the development step (film thickness (FT) after development was 0 µm. The unexposed film thickness loss or dark field loss (DFL) of 100% was calculated based on film thicknesses before and after development. The dissolution of both exposed and unexposed areas of the film are too high to generate an image.

Example 29

This Example 29 further illustrates improved properties of the composition of this invention, such as for example, shelf life stability, and improved thermomechanical properties of the post exposure cured films.

The polymer of Example 13 was dissolved in PGMEA to form a 30 wt. % solution. This solution was heated while stirring in a closed reaction vessel under nitrogen atmosphere at 110° C. for 3 hours. A composition in accordance with this invention was then prepared using this polymer solution having the specific amounts of additives, expressed as parts per hundred resin (phr): TrisP3M6C-2-201 (35 phr) as a photo-active compound, VG3101L (30 phr) and GE-36 (30 phr) as epoxide crosslinkers, KBM-403E (5 phr) as an adhesion promoter, WPBG-174 (5 phr) as a thermal base catalyst, FC-4432 (0.3 phr) as a surface leveling agent and PGMEA (260 phr) as the solvent were mixed in an appropriately sized amber HDPE bottle. The mixture was rolled for 18 hours to produce a homogeneous solution. Particle contamination was removed by filtering the polymer solution consequently through 1 µm, 0.45 µm and 0.20 µm pore polytetrafluoroethylene (PTFE) disc filter, the filtered polymer solution was collected in a low particle HDPE amber bottle and parts of the resulting solution stored each at 5° C. and at ambient temperature.

Shelf Life Studies

The viscosity of the composition from Example 29 was monitored for 26 days at room temperature. The viscosity changed as follows; day-0, 350 cps; day-5, 363 cps; day-7, 356 cps; day-15, 363 cps; day-22, 362 cps; day-26, 412 cps. According to these results the viscosity of the composition kept at room temperature increased only about 3% in three weeks, thus demonstrating that the composition of this invention is stable at room temperature.

Photo Imaging Studies

The composition of Example 29 was spin coated at a spin speed of 500 rpm for 10 seconds followed by 850 rpm for 30 seconds on a 4-inch thermal oxide silicon wafer. The coated film was post apply baked (PAB) at 105° C. on a hot plate for 3 minutes to obtain a film thickness of 11.22 µm. The film was then exposed using a combination of a patterned mask and a variable density mask to a broad band Hg-vapor light source (at 365 nm using a band pass filter). The film was developed for 21 seconds with 2.4 wt. % TMAH in a puddle, rinsed with distilled water and dried using a stream of nitrogen. The film thicknesses (FT) after development was 9.75 µm. Contact holes and trenches were formed at 5 µm resolution and observed by an optical microscope. The unexposed film thickness loss or dark field loss (DFL) of 13% was calculated based on film thicknesses before and after development. The film was cured at 200° C. for 2 hours in an oven under nitrogen atmosphere. The film thickness of the unexposed areas lost further 12% and the features generated by photo imaging remained intact at 5 µm resolution as observed by an optical microscope demonstrating that the compositions are suitable for such fine line lithographic resolutions.

Thermomechanical Properties

The composition of Example 29 was spin coated at a spin speed of 500 rpm for 10 seconds followed by 900 rpm for 30 seconds on 5-inch bare silicon wafers and post apply baked (PAB) at 105-110° C. on a hot plate for 3 minutes. This process was repeated to generate five coated films. The films were then exposed using a patterned mask to a broad band Hg-vapor light source (at 365 nm using a band pass filter) at an exposure dose of 500 mJ/cm$^2$. The development of these exposed films by 2.4 wt. % TMAH for 30 seconds retained rectangles of 4.5 mm and 6.5 mm strips on the wafers. These films were hard baked at 200° C. for 2 hrs in an oven kept under nitrogen atmosphere. The film strips were lifted out of the wafer by immersing in 1 wt. % hydrogen fluoride solution and allowed to dry in air. These rectangular films were cut into 20 mm length and mechanical properties were measured by Instron, thermomechanical analysis (TMA) and thermogravimetric analysis (TGA) in nitrogen atmosphere. The results are summarized in Table 4.

TABLE 4

| Tensile Modulus (GPa) | Tensile Strength (MPa) | ETB (%) | CTE (ppmK$^{-1}$) | $T_\alpha$ (° C.) (TMA) | $T_\beta$ (° C.) (TMA) | $T_{d5}$ (° C.) (TGA) |
|---|---|---|---|---|---|---|
| 2.4 ± 0.1 | 77 ± 4 | 36 ± 20 | 64 | 328 | 223 | 328 |

It is evident from the data summarized in Table 4 the composition of this invention exhibit excellent thermomechanical properties. $T_\alpha$ and $T_\beta$ are respectively primary and secondary glass transition temperatures ($T_g$) observed as measured by TMA. $T_{d5}$ is the measure of temperature at which 5 percent weight loss of the composition was observed as measured by TGA.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A composition comprising:
    a polymer comprising one or more distinct first repeating unit represented by formula (IA), each of said first repeating unit is derived from a monomer of formula (I):

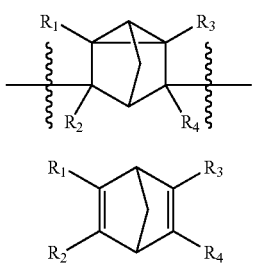

wherein:
    ⌇⌇⌇⌇ represents a position at which the bonding takes place with another repeat unit;
    each of $R_1$, $R_2$, $R_3$ and $R_4$ is independently selected from the group consisting of hydrogen, linear or branched $(C_1-C_{16})$alkyl, hydroxy$(C_1-C_{12})$alkyl, perfluoro$(C_1-C_{12})$alkyl, $(C_6-C_{10})$aryl$(C_1-C_3)$alkyl, —$CO_2R$, halogen and a group of formula (A):

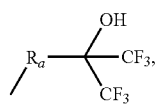

where
    R is $(C_1-C_6)$alkyl or tri$((C_1-C_6)$alkyl)silyl; and
    $R_a$ is selected from the group consisting of —$(CH_2)_p$—, —$(CH_2)_q$—$OCH_2$— and —$(CH_2)_q$—$(OCH_2CH_2)_r$—$OCH_2$—, where p is an integer from 0 to 6, q is an integer from 0 to 4 and r is an integer from 0 to 3;
    one or more distinct second repeating unit represented by formula (IIA), said second repeating unit is derived from a monomer of formula (II):

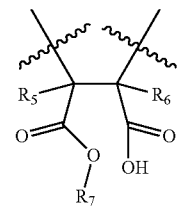

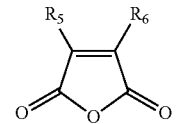

wherein:
    each of $R_5$ and $R_6$ is independently selected from the group consisting of hydrogen, linear or branched $(C_1-C_9)$alkyl and fluorinated or perfluorinated$(C_1-C_9)$alkyl;
    $R_7$ is selected from the group consisting of hydrogen, linear or branched $(C_1-C_9)$alkyl, fluorinated or perfluorinated$(C_1-C_9)$alkyl, and —$(CH_2)_a$-(O-$(CH_2)_b)_c$—$O(C_1-C_6)$alkyl, where a, b and c are integers from 1 to 4; and
    one or more distinct third repeating unit represented by formula (IIIA), said third repeating unit is derived from a monomer of formula (III):

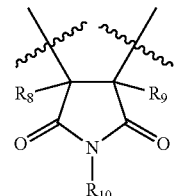

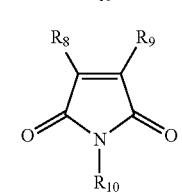

wherein:
    each of $R_8$ and $R_9$ is independently selected from the group consisting of hydrogen, linear or branched $(C_1-C_9)$alkyl and fluorinated or perfluorinated$(C_1-C_9)$alkyl;
    $R_{10}$ is selected from the group consisting of hydrogen, linear or branched $(C_1-C_{16})$alkyl, $(C_3-C_9)$cycloalkyl, $(C_3-C_9)$cycloalkyl$(C_1-C_{10})$alkyl, $(C_6-C_{10})$aryl, $(C_6-C_{10})$aryl$(C_1-C_4)$alkyl, $(C_1-C_{16})$alkyl$CO_2R$, $(C_1-C_{16})$alkyl$CH_2OR$, $(C_6-C_{10})$aryl$CO_2R$ and $(C_6-C_{10})$aryl$CH_2OR$;
    where R is hydrogen, $(C_1-C_6)$alkyl or tri$((C_1-C_6)$alkyl)silyl;
    and wherein molar amount of repeating unit of formula (IIIA) is at least 3 mole percent;
    a photoactive compound;
    a cross-linking agent; and
    a carrier solvent.

2. The composition according to claim 1, wherein said polymer further comprises one or more distinct fourth repeat unit of formula (IVA) derived from a monomer of formula (IV):

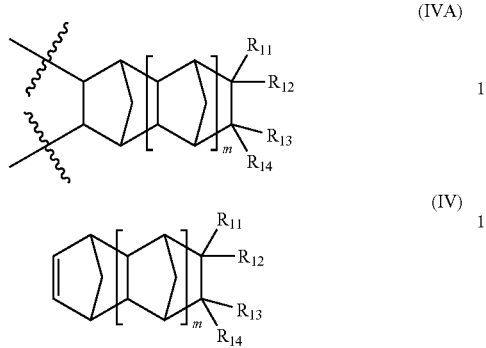

wherein:
   ∿∿∿ represents a position at which the bonding takes place with another repeat unit;
   m is an integer 0, 1 or 2;
   each of $R_{11}$, $R_{12}$, $R_{13}$ and $R_{14}$ is independently selected from the group consisting of hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $-(CH_2)_a-(O-(CH_2)_b)_c-O-(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and halogen.

3. The composition according to claim 1, wherein said polymer further comprises a repeat unit of formula (IB) derived from the monomer of formula (I):

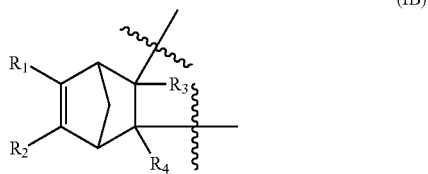

wherein $R_1$, $R_2$, $R_3$ and $R_4$ are each as defined in claim 1.

4. The composition according to claim 1, wherein said polymer comprises one or more distinct repeating units of formula (IA) wherein, each of $R_1$, $R_2$, $R_3$ and $R_4$ is independently selected from the group consisting of hydrogen, methyl, ethyl, linear or branched $(C_1-C_{12})$alkyl and phenyl $(C_1-C_3)$alkyl.

5. The composition according to claim 1, wherein said polymer comprises one or more distinct repeating units of formula (IIA) wherein, $R_5$ and $R_6$ are the same or different and independently of each other selected from hydrogen or methyl; and $R_7$ is selected from hydrogen, methyl, ethyl, n-propyl, iso-propyl or n-butyl.

6. The composition according to claim 1, wherein said polymer comprises one or more distinct repeating units of formula (IIIA) wherein, $R_8$ and $R_9$ are the same or different and independently of each other selected from hydrogen or methyl; and $R_{10}$ is selected from hydrogen, methyl, ethyl, n-propyl, iso-propyl, n-butyl, cyclopentyl, cyclohexyl, cycloheptyl, phenyl, benzyl or phenethyl.

7. The composition according to claim 2, wherein said polymer comprises one or more distinct repeating units of formula (IVA) wherein:
   m is 0;
   each of $R_{11}$, $R_{12}$, $R_{13}$ and $R_{14}$ is independently selected from the group consisting of hydrogen, methyl, ethyl, linear or branched $(C_1-C_{12})$alkyl, phenyl$(C_1-C_3)$alkyl and $-(CH_2)_a-(O-(CH_2)_b)_c-O-(C_1-C_4)$alkyl, where a is 1 or 2, b is 2 to 4 and c is 2 or 3.

8. The composition according to claim 1, wherein said polymer is having one or more distinct first repeating unit derived from a respective monomer selected from the group consisting of:
   bicyclo[2.2.1]hepta-2,5-diene (norbornadiene);
   2-methylbicyclo[2.2.1]hepta-2,5-diene;
   2-butylbicyclo[2.2.1]hepta-2,5-diene;
   2-hexylbicyclo[2.2.1]hepta-2,5-diene;
   2-octylbicyclo[2.2.1]hepta-2,5-diene;
   2-phenethylbicyclo[2.2.1]hepta-2,5-diene;
   tert-butyl bicyclo[2.2.1]hepta-2,5-diene-2-carboxylate;
   trimethylsilyl bicyclo[2.2.1]hepta-2,5-diene-2-carboxylate; and
   bicyclo[2.2.1]hepta-2,5-dien-2-ylmethanol.

9. The composition according to claim 1, wherein said polymer is having one or more distinct second repeating unit derived from a respective monomer selected from the group consisting of:
   maleic anhydride;
   2-methyl-maleic anhydride (3-methylfuran-2,5-dione);
   2,3-dimethyl-maleic anhydride (3,4-dimethylfuran-2,5-dione);
   2-ethyl-maleic anhydride (3-ethylfuran-2,5-dione);
   2,3-diethyl-maleic anhydride (3,4-diethylfuran-2,5-dione);
   2-trifluoromethyl-maleic anhydride (3-trifluoromethylfuran-2,5-dione);
   2,3-bis(trifluoromethyl)-maleic anhydride (3,4-bis(trifluoromethyl)furan-2,5-dione); and
   2-methyl-3-trifluoromethyl-maleic anhydride (3-methyl-4-(trifluoromethyl)furan-2,5-dione).

10. The composition according to claim 1, wherein said polymer is having one or more distinct third repeating unit derived from a respective monomer selected from the group consisting of:
   maleimide;
   N-methylmaleimide;
   N-butylmaleimide;
   3-methylmaleimide (3-methylpyrrolidine-2,5-dione);
   N-cyclohexylmaleimide;
   N-phenylmaleimide;
   N-benzylmaleimide; and
   N-phenethylmaleimide.

11. The composition according to claim 2, wherein said polymer is having one or more distinct fourth repeating unit derived from a respective monomer selected from the group consisting of:
   norbornene;
   5-hexylbicyclo[2.2.1]hept-2-ene;
   5-octylbicyclo[2.2.1]hept-2-ene;
   5-decylbicyclo[2.2.1]hept-2-ene;

5-((2-(2-methoxyethoxy)ethoxy)methyl)bicyclo[2.2.1]hept-2-ene (NBTON);

1-(bicyclo[2.2.1]hept-5-en-2-yl)-2,5,8,11-tetraoxadodecane;

5-benzylbicyclo[2.2.1]hept-2-ene; and 5-phenethylbicyclo[2.2.1]kept-2-ene.

12. The composition according to claim 1, wherein said polymer is selected from the group consisting of:

- a terpolymer of norbornadiene (NBD), maleic anhydride in which maleic anhydride repeating unit is ring opened with methanol and N-phenylmaleimide;
- a terpolymer of norbornadiene (NBD), maleic anhydride in which maleic anhydride repeating unit is ring opened with methanol and maleimide;
- a terpolymer of norbornadiene (NBD), maleic anhydride in which maleic anhydride repeating unit is ring opened with methanol and N-cyclohexyl-maleimide;
- a tetrapolymer of norbornadiene (NBD), 5-((2-(2-methoxyethoxy)ethoxy)methyl)-bicyclo[2.2.1]hept-2-ene (NBTON), maleic anhydride in which maleic anhydride repeating unit is ring opened with methanol and N-phenylmaleimide;
- a tetrapolymer of norbornadiene (NBD), maleic anhydride in which maleic anhydride repeating unit is ring opened with methanol, N-cyclohexylmaleimide and maleimide; and
- a tetrapolymer of norbornadiene (NBD), maleic anhydride in which maleic anhydride repeating unit is ring opened with methanol, N-phenylmaleimide and maleimide.

13. The composition according to claim 1, wherein said photoactive compound comprises one or more of a 1,2-naphthoquinonediazide-5-sulfonyl moiety, 1,2-naphthoquinonediazide-4-sulfonyl moiety as represented by structural formulae (Va) and (Vb), respectively:

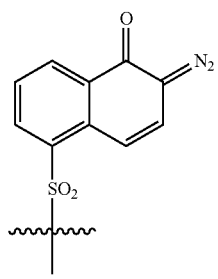

(Va)

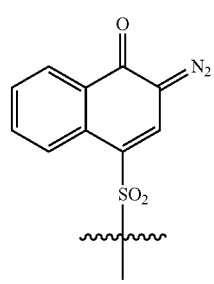

(Vb)

or a sulfonyl benzoquinone diazide group represented by structural formula (Vc):

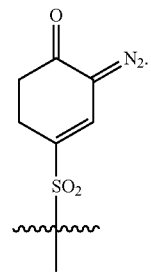

(Vc)

14. The composition according to claim 13, wherein said photoactive compound is selected from the group consisting of:

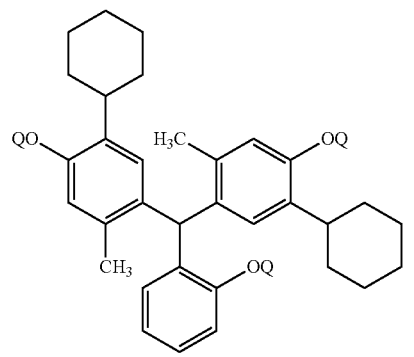

and

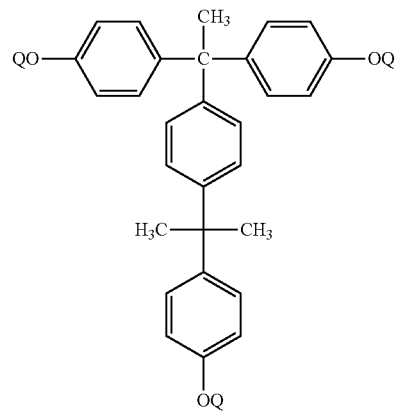

wherein at least one of Q is a group of formula (Va) or (Vb):

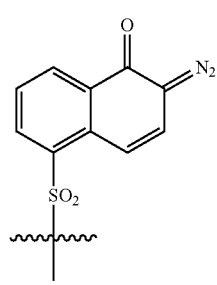

(Va)

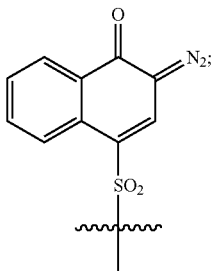

(Vb)

and the remaining Q is hydrogen.

15. The composition according to claim 1, wherein said cross-linking agent is selected from the group consisting of:

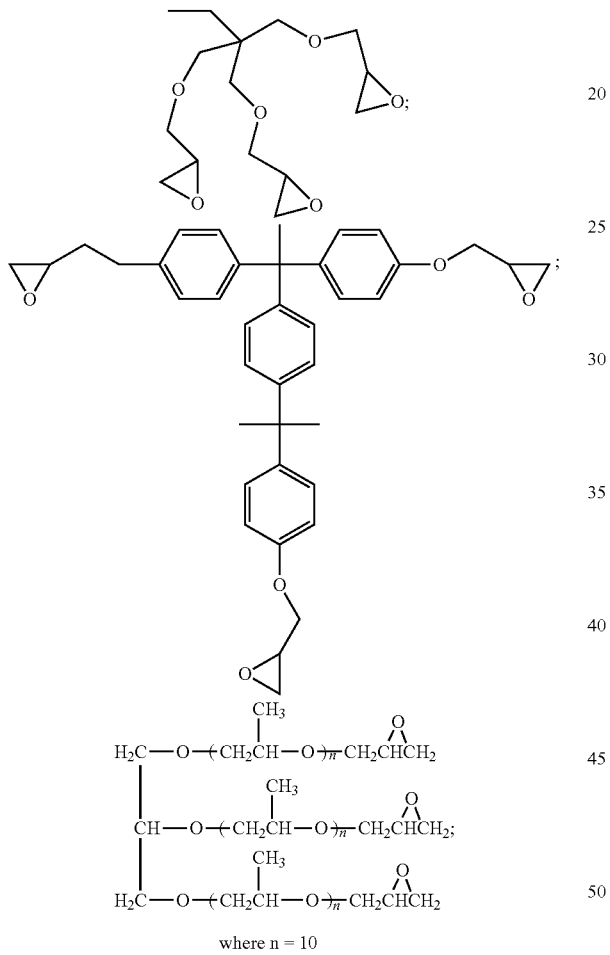

where n = 10 and a mixture in any combination thereof.

16. The composition according to claim 1, wherein said solvent is selected from the group consisting of propyleneglycol monomethylether acetate (PGMEA), N-methylpyrrolidone (NMP) and γ-butyrolactone (GBL) and a mixture in any combination thereof.

17. The composition according to claim 1, wherein said composition further comprises one or more additives selected from the group consisting of:
a photo base generator;
a thermal base generator;
adhesion promoters;
antioxidants;
surfactants; and
mixtures in any combination thereof.

18. A process for forming a cured product, comprising: (i) applying the layer forming polymer composition of claim 1 on a substrate to form a coating film, (ii) exposing the coating film to light through a desired pattern mask, (iii) dissolving and removing the exposed portions by developing with an alkaline developer to obtain the desired pattern, and (iv) heating the obtained desired pattern.

19. A cured product obtained by curing the composition of claim 1.

20. A polymer comprising one or more distinct first repeating unit represented by formula (IA), each of said first repeating unit is derived from a monomer of formula (I):

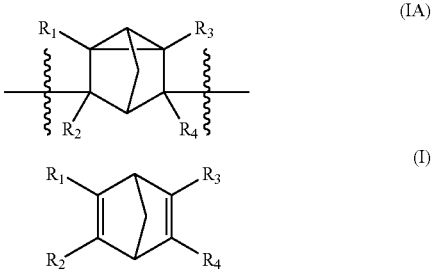

wherein:
⌇⌇⌇ represents a position at which the bonding takes place with another repeat unit;
each of $R_1$, $R_2$, $R_3$ and $R_4$ is independently selected from the group consisting of hydrogen, linear or branched $(C_1$-$C_{16})$alkyl, hydroxy$(C_1$-$C_{12})$alkyl, perfluoro$(C_1$-$C_{12})$alkyl, $(C_6$-$C_{10})$aryl$(C_1$-$C_3)$alkyl, —$CO_2R$, halogen and a group of the formula (A):

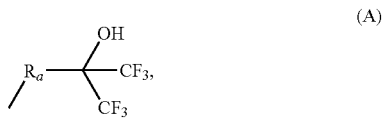

where R is $(C_1$-$C_6)$alkyl or tri$((C_1$-$C_6)$alkyl)silyl; and
$R_a$ is selected from the group consisting of —$(CH_2)_p$—, —$(CH_2)_q$—$OCH_2$— and —$(CH_2)_q$—$(OCH_2CH_2)_r$—$OCH_2$—, where p is an integer from 0 to 6, q is an integer from 0 to 4 and r is an integer from 0 to 3;
one or more distinct second repeating unit represented by formula (IIA), said second repeating unit is derived from a monomer of formula (II):

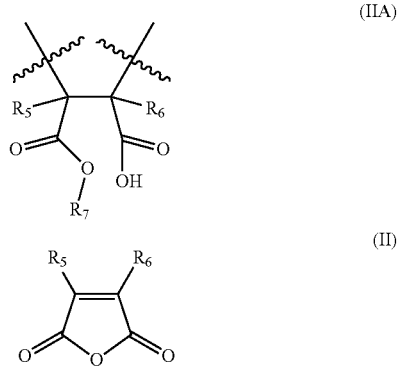

wherein:
each of $R_5$ and $R_6$ is independently selected from the group consisting of hydrogen, linear or branched $(C_1$-$C_9)$alkyl and fluorinated or perfluorinated$(C_1$-$C_9)$alkyl;

$R_7$ is selected from the group consisting of hydrogen, linear or branched $(C_1-C_9)$alkyl, fluorinated or perfluorinated$(C_1-C_9)$alkyl, and $—(CH_2)_a\text{-}(0\text{-}(CH_2)_b)_c—O—(C_1-C_6)$alkyl, where a, b and c are integers from 1 to 4; and one or more distinct third repeating unit represented by formula (IIIA), said third repeating unit is derived from a monomer of formula (III):

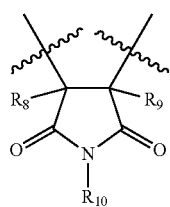
(IIIA)

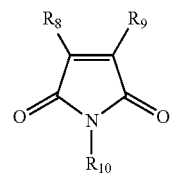
(III)

wherein:
each of $R_8$ and $R_9$ is independently selected from the group consisting of hydrogen, linear or branched $(C_1-C_9)$alkyl and fluorinated or perfluorinated$(C_1-C_9)$alkyl;
$R_{10}$ is selected from the group consisting of hydrogen, linear or branched $(C_1-C_{16})$alkyl, $(C_3-C_9)$cycloalkyl, $(C_3-C_9)$cycloalkyl$(C_1-C_{10})$alkyl, $(C_6-C_{10})$aryl, $(C_6-C_{10})$aryl$(C_1-C_4)$alkyl, $(C_1-C_{16})$alkylCO$_2$R, $(C_1-C_{16})$alkylCH$_2$OR, $(C_6-C_{10})$arylCO$_2$R and $(C_6-C_{10})$arylCH$_2$OR; where R is hydrogen, $(C_1-C_6)$alkyl or tri($(C_1-C_6)$alkyl)silyl;
and wherein molar amount of repeating unit of formula (IIIA) is at least 3 mole percent.

* * * * *